(12) United States Patent
Cook et al.

(10) Patent No.: US 11,742,693 B2
(45) Date of Patent: Aug. 29, 2023

(54) HIBERNATE CONTROL CIRCUITS FOR BATTERY POWER SWITCHING

(71) Applicant: CALAMP CORP., Irvine, CA (US)

(72) Inventors: Russell Cook, Irvine, CA (US); Justin Flor, Irvine, CA (US)

(73) Assignee: CALAMP CORP., Irvine, CA (US)

( * ) Notice: Subject to any disclaimer, the term of this patent is extended or adjusted under 35 U.S.C. 154(b) by 94 days.

(21) Appl. No.: 17/381,104

(22) Filed: Jul. 20, 2021

(65) Prior Publication Data

US 2021/0351608 A1 Nov. 11, 2021

Related U.S. Application Data

(63) Continuation of application No. 16/132,165, filed on Sep. 14, 2018, now Pat. No. 11,070,077.

(60) Provisional application No. 62/666,691, filed on May 3, 2018.

(51) Int. Cl.
| | |
|---|---|
| *H02J 9/06* | (2006.01) |
| *H02J 9/00* | (2006.01) |
| *H03K 3/037* | (2006.01) |
| *G06F 1/3287* | (2019.01) |
| *G05B 19/042* | (2006.01) |
| *H03K 19/20* | (2006.01) |

(52) U.S. Cl.
CPC .......... *H02J 9/061* (2013.01); *G05B 19/042* (2013.01); *G06F 1/3287* (2013.01); *H02J 9/005* (2013.01); *H03K 3/037* (2013.01); *G05B 2219/25257* (2013.01); *H03K 19/20* (2013.01)

(58) Field of Classification Search
CPC ........ H02J 9/061; H02J 9/005; G05B 19/042; G05B 2219/25257; G06F 1/3287; H03K 3/037; H03K 19/20
See application file for complete search history.

(56) References Cited

U.S. PATENT DOCUMENTS

| | | | |
|---|---|---|---|
| 6,072,250 | A | 6/2000 | Thandiwe et al. |
| 6,144,186 | A | 11/2000 | Thandiwe et al. |
| 8,224,402 | B2 | 7/2012 | Sengupta et al. |
| 8,781,442 | B1 * | 7/2014 | Link, II ................... H04L 9/30 370/338 |
| 9,084,197 | B2 * | 7/2015 | Murray ............. H04W 52/0251 |
| 2003/0231002 | A1 | 12/2003 | Johnson |
| 2009/0164819 | A1 | 6/2009 | Berger et al. |
| 2013/0080819 | A1 | 3/2013 | Bowling et al. |
| 2016/0241699 | A1 * | 8/2016 | Milnark ................. H04W 4/44 |
| 2017/0329386 | A1 | 11/2017 | Winemiller et al. |

\* cited by examiner

*Primary Examiner* — Nimesh G Patel
(74) *Attorney, Agent, or Firm* — Barnes & Thornburg LLP

(57) ABSTRACT

In one embodiment, a vehicle telematics device is disclosed with a hibernate control circuit. The hibernate control circuit can selective switch battery power on and off to hibernatable circuits. The hibernate control circuit can be responsive to external main power availability, battery charge condition, and a periodic low frequency clock in the generation of a battery switch enable A power supply switch can be selectively controlled by the battery switch enable signal to switch battery power on and off to the hibernatable circuits.

20 Claims, 10 Drawing Sheets

HIBERNATE CONTROL CIRCUITS FOR BATTERY POWER SWITCHING

CROSS-REFERENCE TO RELATED APPLICATION

The present application is a continuation of and claims priority under 35 U.S.C. § 120 to U.S. patent application Ser. No. 16/132,165, entitled "Hibernate Control Circuits for Battery Power Switching" by Cook et al., now U.S. Pat. No. 11,070,077, which was filed on Sep. 14, 2018 and which claims priority to under 35 U.S.C. § 119(e) to U.S. Provisional Patent Application No. 62/666,691, entitled "Hibernate Circuits," which was filed on May 3, 2018, the entirety of each of which is expressly incorporated herein by reference.

FIELD OF THE DISCLOSURE

The embodiments relate to power management of electronic devices powered by a battery.

BACKGROUND

Many portable electronic devices utilize a rechargeable battery to provide power. These devices include computers, cellular telephones, pagers, radios, and the like. After completion of assembly, the electronic devices are often tested and the rechargeable batteries fully charged with an initial charge cycle. After testing, assembled electronic devices are often stored in inventory before being sold or installed. Accordingly, after testing and the full recharge, rechargeable batteries may be stored for long periods of time, before an initial use and installation. During storage of the battery in an electronic device or not, deep discharging can occur to the cells of a battery. The amount of energy lost between the time when the battery is initially charged before shipment and the first use of the battery, can result in the battery being deeply discharged. Even when the battery is not being used within an electronic device, energy is lost due to the internal circuitry contained within a rechargeable battery.

Telematics is the integrated use of telecommunications and informatics. Telematics units are installed in vehicles to provide a variety of telematics functionality in the vehicle. This functionality includes, but is not limited to, emergency warning systems, navigation functionality, safety warnings, and automated driving assistance. Telematics units are also capable of recording data related to the operation of the vehicle and providing that information for analysis, whether in real-time or during a time when the vehicle is being serviced. This information can be used in a variety of applications, such as fleet tracking; shipment tracking; insurance calculations, and in vehicle management and service.

SUMMARY

Hibernate control circuits in accordance with embodiments are disclosed herein and best summarized by the claims that follow below.

BRIEF DESCRIPTION

The description will be more fully understood with reference to the following figures, which are presented as exemplary embodiments and should not be construed as a complete scope, wherein.

DETAILED DESCRIPTION

Turning now to the drawings, hibernate control circuits in accordance with various embodiments are disclosed. Prior art systems often employ one of a variety of existing techniques for managing the power state for a variety of components. For example, the Advanced Configuration and Power Interface (ACPI) standard provides a system for managing the power state of components via a set of instruction lists and a virtual machine that allows the operating system of a personal computer to a variety of power states. Additionally, a variety of microcontrollers allow for low power states and provide an interrupt for powering up the microcontroller when power is supplied to the microcontroller. However, these existing techniques have some significant limitations. ACPI is extremely complex, requires extensive support in the operating system, and is widely considered a security risk because the byte code provided to perform the functions specified in the instruction lists must be run by the operating system with full privileges.

Microcontrollers can remain powered up by battery power after assembly and test, but placed into a lower power state to conserver power. Low power states for microcontrollers are typically in the 250 micro-ampere or micro-amp (µA) range, which can still lead to significant battery drain for devices over long periods of time. Peripheral circuits around microcontrollers are often left powered on as well to be ready to support the microcontroller when it wakes up out of a lower power state. The peripheral circuits around the microcontroller can add to the power consumption of an electronic device over time and shorten the time to reach full discharge of a battery. Moreover, non-rechargeable batteries if used, have a fixed battery life. Even the lower power state of a micro-controller can shorten the lifespan of non-rechargeable batteries and the devices incorporating them.

Figure 1:
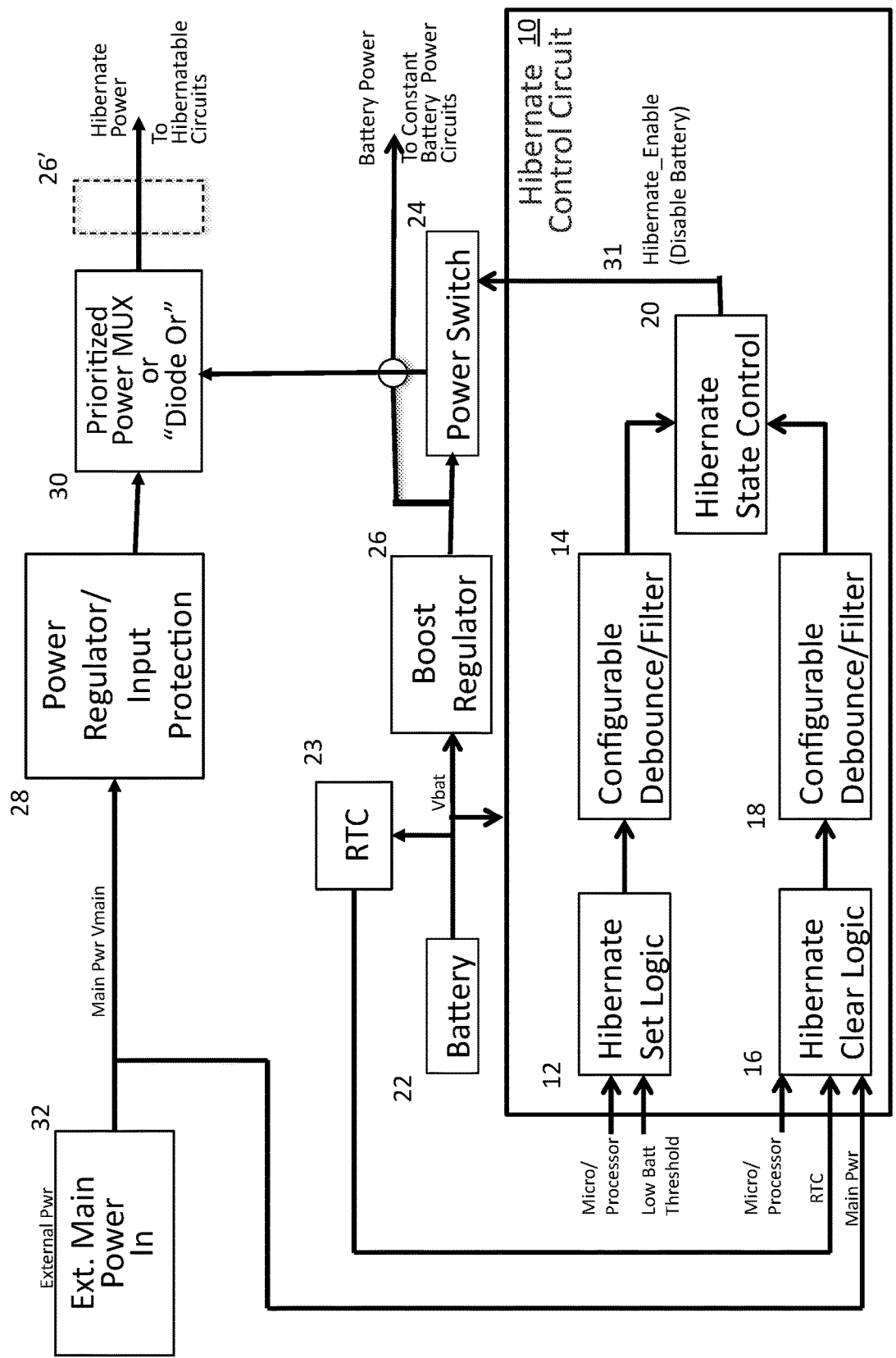
FIG. 1 is a functional block diagram of portions of an electronic device, such as a telematics device, including hibernation logic.

Referring now to FIG. 1, a functional block diagram of an electronic device with a hibernate control circuit 10 is shown. The electronic device includes circuits that require constant battery power, such as some of the circuits in the hibernate control circuit 10 for example, to which battery power is never disconnected. The electronic device vice also includes circuits (not shown in FIG. 1) that do not require constant battery power. These circuits can have battery power switched off so they are powered down when main power is not provided. These circuits that can be switched off the battery power are sometimes referred to herein as hibernatable circuits. The power that the hibernatable circuits receive can be referred to herein as hibernate power received from a hibernatable power bus. A power switch 24 (and/or power multiplexer 30) (e.g., see FIGS. 4E-4F) under control of a hibernate enable output signal 31 disabling battery power (or its inversion, battery switch enable VBS-W_EN output signal 140,240,450 enabling battery power shown in FIGS. 2A-2C, 3, and 4A for example) can be used to selectively switch battery power from the battery 22 on and off to the hibernatable circuits. Some circuits in the electronic device may only be coupled to the external main power, such as test circuits for example that can interface to an external tester. The external main power 32 can also be selectively coupled to the hibernatable circuits through a power multiplexer 30 (e.g., see FIGS. 4E-4F) when its power is available. Accordingly, the hibernatable circuits may be expecting a power supply voltage from the main power bus (e.g., 5 or 12 volts) that is greater than the battery supply voltage (e.g., 3 volts) from the battery power bus.

In the case when main power is unavailable and battery power is to be used to power the hibernatable circuits, a boost regulator 26 can be provided to boost the battery voltage Vbat up to the voltage that the hibernatable circuits may be expected to receive. In an alternate embodiment, a boost regulator 26' (such as a buck-boost regulator) can be provided at the output of power multiplexer 30 to boost the battery voltage Vbat up and/or regulate main power voltage to that voltage expected by the hibernatable circuits.

The external main power 32 can be subject to voltage fluctuations of a system and experience noise transients that could spike currents and damage circuitry. In this case, the electronic device can include a power regulator/input protection circuit 28 that regulates main power to a more stable voltage for the hibernatable circuits. The power provided by the power regulator 28 can also be used to recharge a rechargeable battery 22.

The electronic device can also include a micro-controller or microprocessor (see processor 310 in FIG. 5 for example) that can generate a hibernate input control signal (hibernate command signal) and hibernate clear input control signal (clear hibernate command signal) for the hibernate control circuit 10. The micro-controller can have its own internal low frequency clock/counter (e.g., see clock oscillator 510 in FIG. 5) that can be used to periodically wake up the hibernatable circuits. In this case, portions of the micro-controller are coupled to battery power Vbat to allow the low frequency clock/counter run while other portions of the micro-controller can be coupled to hibernate power and switched off In an alternate embodiment, the electronic device includes its own low frequency clock oscillator/counter/timer 23 that receives battery power Vbat over the battery power supply bus from the battery 22 to continually operate. In this case, substantially all of the micro-controller can be coupled to the hibernate power and selectively powered off in hibernate mode to minimize power drain from the battery 22. The micro-controller can be periodically powered back up by the hibernate control circuit 10 based on the low frequency clock oscillator/counter 23 power, external main power being provided, or external signal source for the hibernate clear signal input.

The hibernate control circuit 10 can include hibernate set logic 12; hibernate clear logic 16; configurable debouncers/filters 14, 18; and a hibernate state controller 20. The hibernate set logic 12 and the hibernate clear logic 16 receive various input signals to respectively set and clear the state of the hibernate state controller 20. The configurable debouncer/filter 14 is coupled to the hibernate set logic 12 to validate the input signals that can set the hibernate enable signal to disconnect hibernatable circuits from the battery 22. Similarly, the configurable debouncer/filter 18 is coupled to the hibernate clear logic 16 to validate the input signals that can clear the hibernate enable output signal to allow battery voltage from the battery 22 to be supplied to the hibernatable circuits.

The hibernate state controller 20 is coupled to the configurable debouncers/filters 14, 18 to receive the set and clear signals to respectively set and clear the hibernate state of the hibernate state controller 20. Based on being set in the hibernate state, the hibernate state controller 20 generates a hibernate enable signal that is used to gate the battery power to various circuits of an electronic device, such found in a vehicle telematics device. When cleared of the hibernate state, the hibernate state controller 20 does not generate the hibernate enable signal for the power switch 24, such that the battery power from the battery 22 is provided to the various hibernatable circuits of the electronic device. In this case, the hibernate state controller 20 can instead be considered to be generating a battery switch enable signal for the power switch 24, the opposite of the hibernate enable signal.

The hibernate set logic 12 couples to a microprocessor (microcontroller) to receive a hibernate power down command signal to cause the generation of the hibernate enable signal 31 (or its inverse battery switch enable) by the state controller 20. The hibernate set logic 12 further couples to a battery voltage sensor (comparator) to receive a low battery threshold input signal to alternatively cause the generation of the hibernate enable signal 31 by the state controller 20. A hibernate set signal generated by the hibernate set logic 12 is coupled into the configurable debouncer/filter 14. The debouncer/filter 14 analyzes the set signal to be sure it is just not noise or an inadvertent set signal generated by the set logic. The logic 10 wants to be sure that a valid hibernate enable signal 31 is generated before gating power to any circuit. If the set signal is valid, the set signal is coupled into the hibernate state controller 20 that then generates the hibernate enable signal 31 in response to the valid set signal. If the set signal is not valid, the invalid set signal is not coupled to the hibernate state controller 20 and the hibernate enable signal is not generated.

For hibernatable circuits in a hibernate state, it can be desirable to periodically wake them up out of the hibernate state in order to carry out certain functions for a period of time. Other active circuits or portions thereof not in the hibernate state (e.g., low power oscillator or micro-controller) can issue an activate power up command signal to wake up those hibernating circuits. If main power from a source other than the local battery is selectively provided, sensing main power can also wake up the hibernating circuits. The main power can be switched on when a vehicle is started up and the engine running, for example. The main power is shut off when the vehicle is turned fully off, with the engine shut off for example. An RTC signal can also be used to wake up the hibernating circuits. The hibernate clear logic 16, is coupled to the microprocessor (microcontroller) to receive a power up command signal. The hibernate clear logic 16, is also coupled to the main power or a main power sensor to sense when the main power is selectively provided. The hibernate clear logic 16 can also be coupled to a low frequency oscillator/counter to receive the a real time clock/ interrupt (RTC/INT) signal to periodically wake the hibernatable circuits. The hibernate clear logic 16 generates a hibernate clear signal that can be used to reset the hibernate state control 20 and turn off the hibernate enable signal 30. However, the clear signal generated by the hibernate clear logic 16 is first analyzed by the configurable debouncer/filter 18 to ensure a valid clear signal has been generated. If the clear signal is valid, the clear signal is coupled into the hibernate state controller 20 that clears the hibernate state and causes the hibernate enable signal 31 to no longer be generated. If the clear signal is not valid, the invalid clear signal is not coupled to the hibernate state controller 20 and the generation of the hibernate enable signal 31 is maintained.

The hibernate logic can be implemented in hibernate control circuits in accordance with embodiments. Hibernate control circuits can keep a device in a very low power hibernate state with an ultra-low power draw. Hibernate control circuits can be utilized to selectively enable and disable battery power provided to a device, or portions of a device, by gating the battery voltage. Many hibernate control circuits allow for an external real-time clock (RTC) interrupt and/or main power detection as wakeup methods in accordance with embodiments. In a variety of embodiments, a micro-controller can command entry into a hibernate state after completion of a function and it is ready to be powered down. Hibernate control circuit can include a delay pipe used to buffer a hibernate signal from the microcontroller to ensure hibernate signal integrity as appropriate to the requirements of specific applications of embodiments. Hibernate control circuits in accordance with embodiments provide a secure, ultra-low power hibernate state for devices. In several embodiments, hibernate control circuits will bring hibernate current below 5 µA. This ultra-low current draw significantly improves the shelf life of the battery-powered devices and can improve the long-term cycle life of the battery. Additionally, the complexities and insecurities of other commonly utilized power-saving techniques such as ACPI are eliminated.

The hibernate control circuits can be used in different ways to provide low power. During production testing with a tester (ATE equipment) in an assembly factory (factory mode), the device is powered up with main power and the battery switch enable is set to high to allow the hibernatable circuits to be tested along with the circuits that constantly receive battery power. After completion of testing and before sales, the micro controller prepares the device for shut down by pulsing the Hibernate signal. This cause the battery switch enable signal (VBSW_EN) to go low disconnecting the battery from the hibernatable circuits. The tester can then remove the external main power source to the device when it is in the low power hibernate state or mode. In this low power hibernate state or mode, the hibernate control circuit allows for extended shelf life over circuits that lack a hibernate control circuit and a hibernate mode. Because the micro-controller is shut off completely unable to be controlled to overcome the hibernate state, the hibernate state is cleared in this case by reconnecting the hibernate control circuit to the external main power.

In another case, the electronic device with the hibernate control circuit is installed in the field with an external switchable main power supply (field real time clock mode). When main power is removed from the device and it is running on battery power the device can put itself in a hibernate mode with a future wakeup from hibernate mode. The micro controller first programs the counter of the lower frequency oscillator for a future wakeup by the real time clock interrupt signal (RTC_INT). The microcontroller then pulses the Hibernate control input signal line to send the electronic device into hibernate mode and cut the battery power to the hibernatable circuits. Battery power is still used to power the low frequency oscillator (RTC) and the hibernate control circuit. When the counter of the low frequency clock (RTC) counts to the future time/date (or counts down to expiration), the low frequency clock generates an interrupt input signal (RTC_INT) to the hibernate control circuit that cause it to generate the battery switch enable signal (VBSW_EN) and power up the micro controller ((or wake it up from sleep mode). In this case, the hibernate condition can be cleared by microcontroller if needed.

In still another case, the electronic device with the hibernate control circuit is installed in the field, but the battery has or is near an over discharge condition (Field Battery Overdischarge Protection). It is desirable to protect the battery by further reducing current draw and the rate of discharge of a battery. The battery condition can be sensed by the hibernate control circuit by monitoring the battery voltage output level. Near an over discharge condition of the battery, the device is typically operating from its battery with external main power being removed or switched off. The hibernate control circuit can sense If the battery condition (voltage) is determined to be below a predetermined threshold voltage, indicating a near over discharge condition. If the hibernate control circuit senses this battery condition, it can cause the hibernate mode to be entered by disabling the battery switch enable signal. The micro-controller can also be programmed to sense the battery condition and prepare to be shut down. The microcontroller then pulses the hibernate signal to the hibernate control circuit and shuts down. The electronic device is placed into the long term hibernate mode that can be exited when external main power is supplied to power the device and recharge the battery. If the micro-controller is shut down, it may not be able clear the hibernate condition in this case.

It should be noted that, throughout the specification, low power hibernate control circuits are commonly referenced with respect to particular currents and/or signals for clarity in description. However, a reference to a signal and/or current includes a current and/or signal input and/or via which a current and/or signal can be received and/or transmitted as appropriate to the requirements of specific applications of embodiments.

Hibernate Control Circuits

In many embodiments, hibernate control circuits are included in battery powered devices that are also capable of being powered from an external source. A variety of inputs can be provided to a hibernate control circuit in order to control the hibernate state of a variety of devices, such as a main power input (or an indication that the device has been installed), an interrupt (such as a real-time clock signal), and a hibernate signal indicating the current state of the device. Hibernate control circuits can output a signal indicating if the connected device(s) should remain in a hibernate state or transition to a wake (e.g. active) state. Hibernate control circuits can be utilized in a variety of ways to keep a device in an ultra-low power state.

A first example using a hibernate control circuit (e.g., FIG. 2A) to keep an electronic device in an ultra-low power state is during the testing of devices. In this example, the electronic device can be powered up and the active high battery switch enable output control signal (active low hibernate control output signal) is set to a logic high (e.g. keeping the device in an active state). Testing on the device, such as by automated testing equipment, can then be completed with the active device. The processor of the device can then prepare for shut down and provide a hibernate input control signal to the hibernate control circuit. This hibernate input control signal can cause the hibernate control circuit to generate a low logic level for the active high battery switch enable output control signal (active low hibernate output control signal) to keep hibernatable circuits in the electronic device in a hibernate state. In many embodiments, a transition from active to can occur within 1 micro-second (µs). Main power can then be removed from the device and the device is now in a low power hibernate mode that will allow extended shelf life using a battery connected to the device.

A second example using a hibernate control circuit (e.g., FIG. 3) includes controlling the hibernate state of a device deployed in the field. When the main power is removed from the device and the device is running on battery power, the device can put itself into a hibernate mode with a future wakeup. In this example, the device can achieve extremely low hibernate current draw using the hibernate control circuit, extending the amount of time the device can be deployed in the field without main power and without needing to be serviced. The processor of the device can program a real-time clock for a future wakeup by an interrupt control signal RTC_INT and then pulse a hibernate input signal, thereby causing the hibernate control circuit to maintain connected circuits (hibernatable circuits) to the hibernatable power bus in a hibernate state. The battery of the device can be used to power the real-time clock, as well as the hibernate control circuit, so once the programmed time/date is reached, the interrupt control signal (RTC/INT) can be provided to the hibernate control circuit to wake up the hibernatable circuits. The hibernate control circuit can then generate a logic level low hibernate output control signal (or logic level high for battery switch enable), thereby powering up the micro-controller and/or the device with the battery power provided by the battery.

A third example includes using hibernate control circuits to prevent a battery from over discharging. When main power is removed from a device and it is running on battery power, the device can put itself into a long term hibernate mode if the battery is determined to be below a threshold voltage. In this scenario, the processor prepares to be shut down and then pulses a hibernate command signal. At this point, the device enters a hibernate mode and will not power up until main power is applied and/or the battery is recharged/replaced so that its voltage exceeds the threshold voltage.

Although the above examples include a main power source, it should be noted that a variety of embodiments include an install signal indicating that the device has been installed in a place without an external main power source. In this way, self-powered devices can automatically be powered up when installed, even in embodiments where the electronic devices are installed in environments where no external power is provided. Accordingly, hibernate control circuits can utilize this installed signal to control the hibernate state of a processor (or any other device) as appropriate to the requirements of specific applications of embodiments. In a variety of embodiments, the main power source is provided by a vehicle. However, hibernate control circuits in accordance with many embodiments are incorporated into devices having an energy harvester, such as solar panels, that can be utilized to charge the battery.

A variety of hibernate control circuits in accordance with embodiments can be set to a hibernate state and cleared when connected to a power source. Many hibernate control circuits are unable to clear a hibernate condition once it is set, without removal and reconnection to the power source.

Figure 2A:
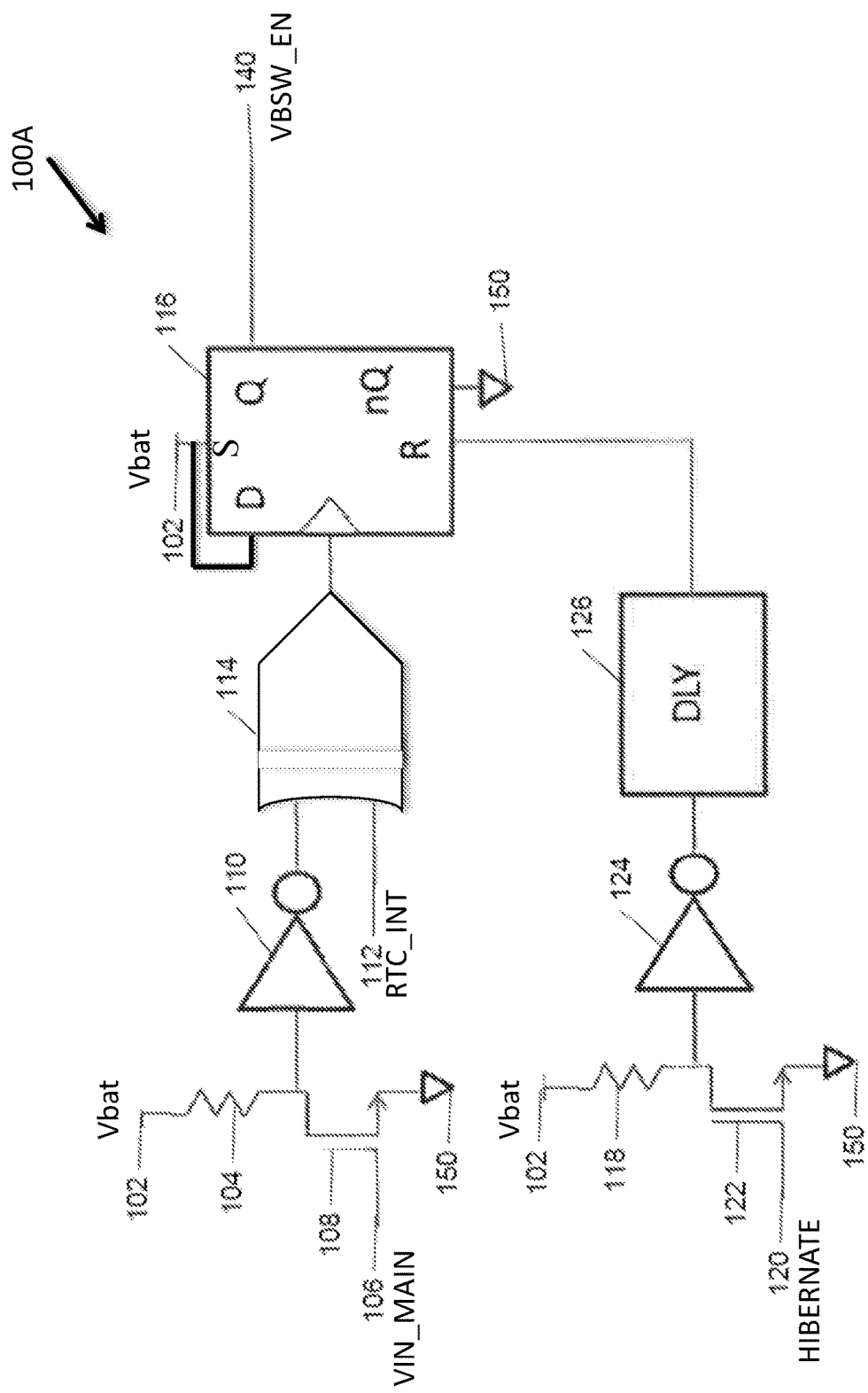
FIG. 2A is a schematic diagram of a hibernate control circuit in accordance with an embodiment.

Referring now to FIG. 2A, a hibernate control circuit 100A is shown. The hibernate control circuit 100A includes resistors 104,118; transistors 108,122; NOT gates (inverters) 110, 124; a two input OR gate 114; a delay circuit 126, and a flip flop 116 coupled together as shown to generate a battery switch enable control signal 140. The inverse or negative battery switch enable control signal is a hibernate enable control signal to disable use of battery power by the hibernatable circuits. When battery switch enable control signal 140 is enabled (e.g., logic high level for active high logic), the circuits that are under its control receive battery power. When battery switch enable control signal 140 is disabled (e.g., logic low level), the circuits that are under its control are disconnected from battery power to conserve the charge of the local battery. Other circuits in a system, can just receive a switchable main power source that is not from the local battery. These other circuits do not need battery power and do not need to be periodically powered up, regardless of the status of the switchable main power that can be turned on or off.

The hibernate control circuit 100A and its circuit elements receive a battery voltage Vbat 102 from a battery power supply bus coupled to a battery. The battery voltage 102 is generally supplied to logic (e.g., inverters 110,124; delay circuit 126, logic gate 114, flip flop 116) of the hibernate control circuit and other circuits of a system that need a constant power source. A gate of the transistor 108 is coupled to a main power supply bus to receive a main voltage input VIN_MAIN 106 and sense whether or not main power (e.g., voltage) is provided or not by the main power supply bus to the system. The drain of the transistor 108 generates a sensed main power presence signal (active low) based on the level of voltage of the main voltage input VIN_MAIN 106. The hibernate control circuit 100A further can receive an input hibernate command signal 120 that is coupled to the gate of transistor 122. The input hibernate command signal 120 can be provided locally by a micro controller or micro-processor or externally by an external controller.

An output from the hibernate control circuit 100A is a battery switch enable control signal VBSW_EN 140 selectively generated at the Q output of the flip flop 116. In accordance with some embodiments, the flip-flop 116 is a positive edge triggered D-type flip flop with a D input coupled to the battery power supply Vbat to receive a logic high value. Accordingly when the flip flop 116 is clocked, a logic high level is clocked into and stored by the flip flop. A set input S of the flip flop 116 is also coupled to the battery power supply Vbat to receive a logic high value so that upon initial receipt of battery power (e.g., when a battery is first connected to the battery power supply bus), the Q output of the flip flop is set to a logic high level. The flip flop 116 includes a reset input R that when asserted high, can reset the Q output of the flip flop to a logic low level overriding the set input. The flip flop 116 include a negative Q output nQ that generates inverse logic levels to that of the Q output. In some embodiments, a negative battery switch enable control signal VBSW_ENP is generated by the nQ output of the flip flop 116.

In a signal path to clock the flip flop 116 and sense when main power is switched off, the gate of the transistor 108 receives the main voltage input VIN_MAIN 106. The drain of transistor 108 is coupled to one end of resistor 104 and to the input of the NOT gate (inverter) 110. The opposite end of the resistor 104 is coupled to the battery power supply Vbat 102. The source of transistor 108 is coupled to ground 150. The output of inverter (NOT gate) 110 is coupled into one input of the two input OR gate 114. The output of the OR gate 114 is coupled into the clock input of the flip flop 116 to clock the flip flop and generate a logic level high for the battery switch enable control signal 140 when main power is available.

As mentioned previously, the main voltage input 106 is coupled into the gate of the transistor 108. The resistor 104 and transistor 108 together sense whether or not power (e.g., voltage) is provided or not by the main power supply 106. When main power is unavailable, it may be desirable to power off the hibernatable circuits. If a voltage provided at the gate is less than the threshold of the transistor 108 (e.g., main power is switched off), the transistor is OFF and the resistor 104 can pull up on the drain of the transistor up to the battery voltage provided by battery power supply 102. In this case, the inverter 110 inverts a high logic level and generates a low level at its output that is coupled into one input of the OR gate 114. If the input clock signal 112 is also a logic low level, the output of the OR logic gate 114 is also a logic low level. Accordingly, with a logic low level at the output of the OR logic gate 114, it does not clock the flip flop 116 to generate the battery switch enable control signal until main power is switched back on or the low frequency clock 112 wakes up hibernating circuits. If the battery switch enable control signal is reset to logic zero, the hibernatable circuits can remain in a hibernating or powered down state when main power is unavailable.

If a voltage provided at the gate of transistor 108 by the main power supply 106 is greater than the turn-on threshold of the transistor (e.g., main power is available), transistor 108 is switched ON and pulls its drain towards ground 150 against the pull up resistor 104 to reach a logic low logic level. In this case, the low logic level coupled into the input of the inverter 110 causes the inventor to generate a high logic level at its output that is coupled into an input of the OR gate 114. The OR gate 114 generates a high level logic output that clocks the flip flop 116 to generate the battery switch enable control signal. The hibernatable circuits coupled to the hibernatable power bus are then powered up in response to the battery switch enable control signal going to a high logic level when the main power supply voltage returns. In this case, the hibernatable circuits can use the main power supply multiplexed onto the hibernatable power bus. The hibernatable circuits can also be periodically awaken by a low frequency clock signal 112 and use battery power multiplexed onto the hibernatable power bus.

A low frequency input clock signal 112, generated by a very low frequency oscillator circuit (not shown) is coupled into another input of the two input OR gate 114. The output of the OR gate 114 is coupled into the clock input of the flip flop 116 to clock the flip flop and generate the battery switch enable control signal.

The input clock signal 112 can periodically enable the battery switch enable control signal to occasionally provide power to the hibernatable circuits. This may be to turn on a radio receiver to listen for signals associated with the overall system. The input clock signal can also wake hibernatable circuits to turn on a radio transmitter to periodically transmit data about the overall system, such as location information. In any case, the hibernatable circuits can be periodically provided power in response to the low frequency clock signal 112 to perform a periodic function. In this case, the output of the OR gate 114 into the flip flop 116 periodically changes state (e.g., goes high on a positive edge trigger flip flop) to trigger the flip flop to generate the battery switch enable control signal 140.

A set input S of the flip flop 116 is coupled to the battery power supply 102. A reset or clear input R of the flip flop is coupled to the output of the delay circuit 126. The Q output of the flip flop 116 is coupled to the battery switch enable control signal line 140. Some circuits of flip flop are further coupled to ground 150.

If the battery switch enable control signal is generated to provide power to hibernatable circuits, it is desirable to shut off the battery switch enable control signal and power down the hibernatable circuits.

In the signal path to reset or clear the output of the flip flop 116, the gate of the transistor 122 receives the hibernate input command signal 120. The hibernate input command signal 120 can be received, such as from a processor or microcontroller, when it is desirable to power down the hibernatable circuits coupled to the hibernatable power bus. The drain of transistor 122 is coupled to one end of the pull up resistor 118 and to the input terminal of the inverter (NOT gate) 124. The opposite end of the resistor 118 is coupled to the battery power supply 102. The source of transistor 122 is coupled to ground 150. The resistor 118, transistor 122, and inverter 124 effectively buffer the hibernate input command signal at the output of the inverter 124. The buffered hibernate input command signal at the output of inverter 124 is coupled into the input of the delay circuit 126.

The delay circuit 126 can be an even numbered series of inverters coupled together to generate a predetermined delay in the hibernate command signal 120. The delay circuit 126 can be a programmable delay to trim or select the predetermined delay. The output of the delay circuit 126 is coupled into the clear or reset input of the flip flop 116. The inverter 124 and delay circuit 126 provides a debouncing or filtering function on the input hibernate command signal 120 to validate the command signal before clearing (resetting) the flip flop and disabling the generation of the battery switch enable control signal 140.

Assume that the battery switch enable control signal 140 is generated by the flip flop 116 so that the hibernatable circuits are powered on. Assume that a processor has generated the hibernate control signal 120 to put the hibernatable circuits in a hibernate or powered off state. In this case, the hibernate control signal 120 goes to a logic high level that is coupled to the gate of transistor 122. When above a turn on threshold level, transistor 122 is turned on to pull down on the node at its drain against the resistor 118 pulled up by the battery voltage. The input to the inverter 124 goes to a low logic level. The inverter 124 generates a high logic level at its output that is coupled into the delay circuit 126. Provided that the hibernate control signal 120 is not noise and is provided for a period of time, the high logic level propagates through the delay circuit 126 to be coupled into the reset input of the flip flop 116. The output Q of the flip flop is caused to no longer generate the battery switch enable control signal 140. This switches off the power to the hibernatable circuits so they are powered to off state to conserve energy and battery power.

With the output Q of the flip flop 116 reset to no longer generate the battery switch enable control signal 140, the hibernate control signal 120 can be released, thereby turning off transistor 122. In this case, the resistor 118 pulls up on the input of the inventor 124 to a high logic level. With the transistor 122 off, minimal current flows through the resistor 118 to conserve power. The output of inverter 124 generates a low logic level that is coupled into the delay circuit 126 and eventually the reset input of the flip flop 116. The set input of the flip flop 116 is set to a high logic level. In this case, the flip flop 116 is ready to generate the battery switch enable control signal 140 in response to its clock input receiving a clock input signal with a clock edge (e.g., low to high clock transition). Either the low frequency clock 112 or the main power 106 being supplied can generate the clock input signal with the clock edge and generate the battery switch enable control signal 140.

The battery switch enable control signal line 140 can be coupled to any of a variety of devices, hibernatable circuits, to selectively disable (gate) battery power to put those devices into a hibernation or powered off state when needed.

A number of hibernate control circuits in accordance with embodiments support a finite state machine model of operation, thereby allowing the battery switch enable control signal to be cleared by a microprocessor without reliance on connection and disconnection from a power source.

The Boolean logic of the NOT gate (inverter) 110 and the two input OR gate 114 can be substituted with other Boolean logic to generate the same signal coupled into the flip flop 116.

Figure 2B:
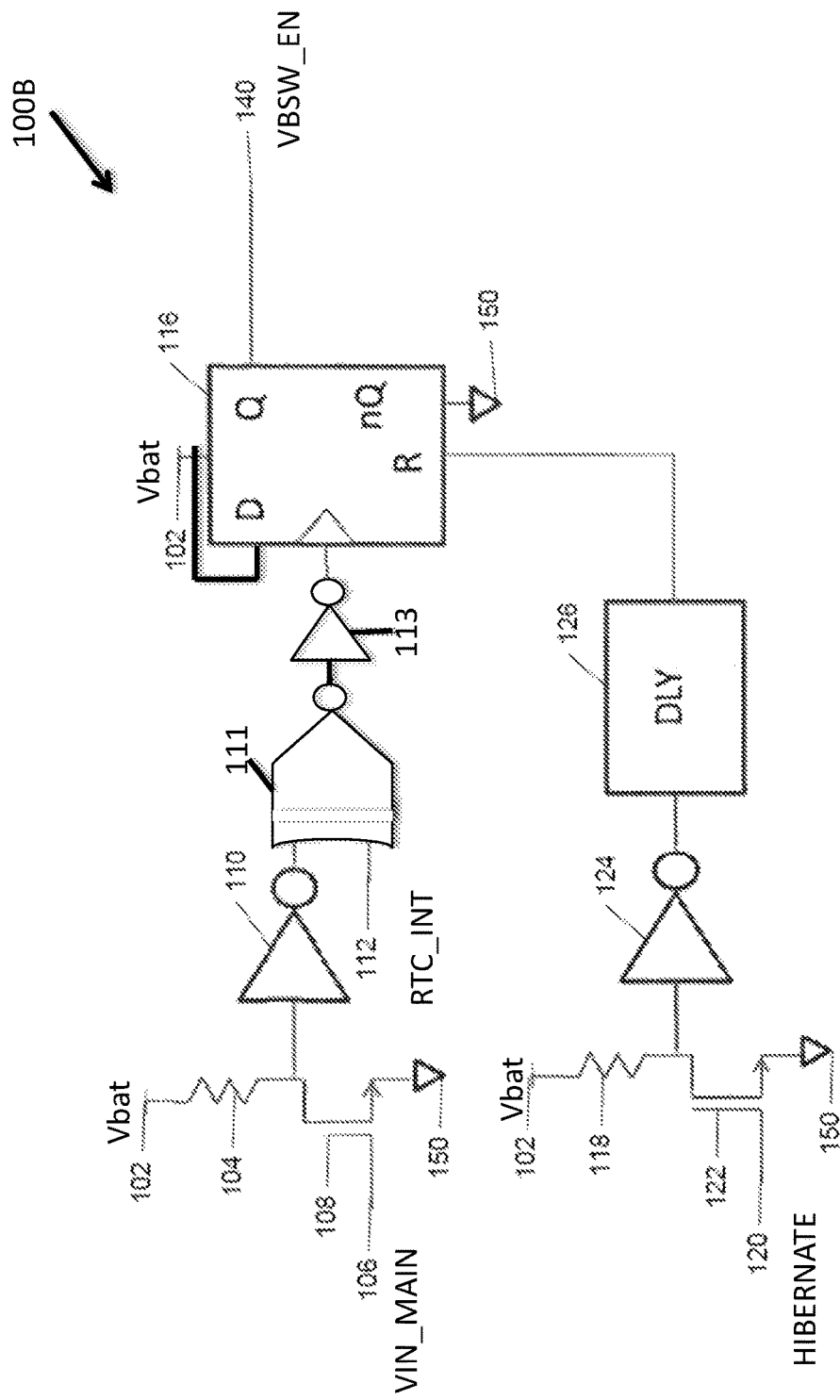
FIG. 2B is a schematic diagram of a hibernate control circuit in accordance with an embodiment.

Referring now to FIG. 2B, a hibernate control circuit 100B is shown. In comparison with the hibernate control circuit 100A, the two input OR gate 114 is replaced by a two input NOR gate 111 and a NOT gate (inverter) 113 in circuit 100B to provide the same Boolean logic function. Otherwise, the hibernate control circuits 100A-100B are similar and further explanation is not needed. The resistor 104 and the transistor 108 sense the main voltage input VIN_MAIN to generate a main power absent signal coupled into the input of the NOT gate 110. The NOT gate 110 inverts the main power absent signal to generate a main power present signal that is coupled into an input of the NOR gate 111. When the main power is present, the main power present signal causes the D flip flop 118 to be clocked and generate the battery switch enable signal allowing main power or battery power to provide power to the hibernatable circuits.

Figure 2C:
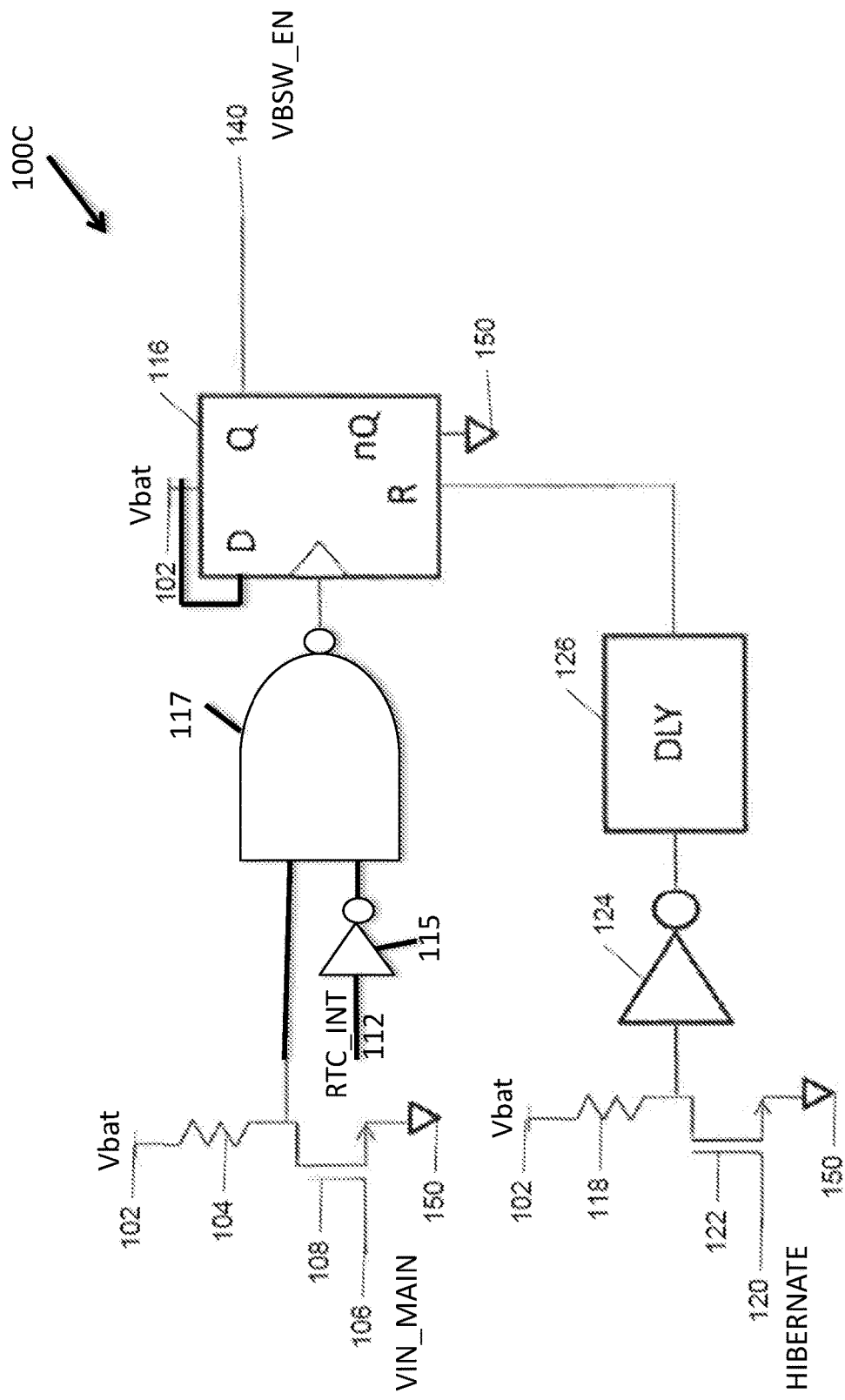
FIG. 2C is a schematic diagram of a hibernate control circuit in accordance with an embodiment.

Referring now to FIG. 2C, a hibernate control circuit 100C is shown. In comparison with the hibernate control circuit 100A, the NOT gate (inverter) 110 and the two input OR gate 114 are replaced by a two input NAND gate 117 and a NOT gate (inverter) 115 in circuit 100C to provide a similar Boolean logic function. The resistor 104 and the transistor 108 sense the main voltage input VIN_MAIN to generate a main power absent signal coupled into one input of the NAND gate 117. Otherwise, the hibernate control circuits 100A, 100B, and 100C are similar and further explanation is not needed.

Figure 4A:
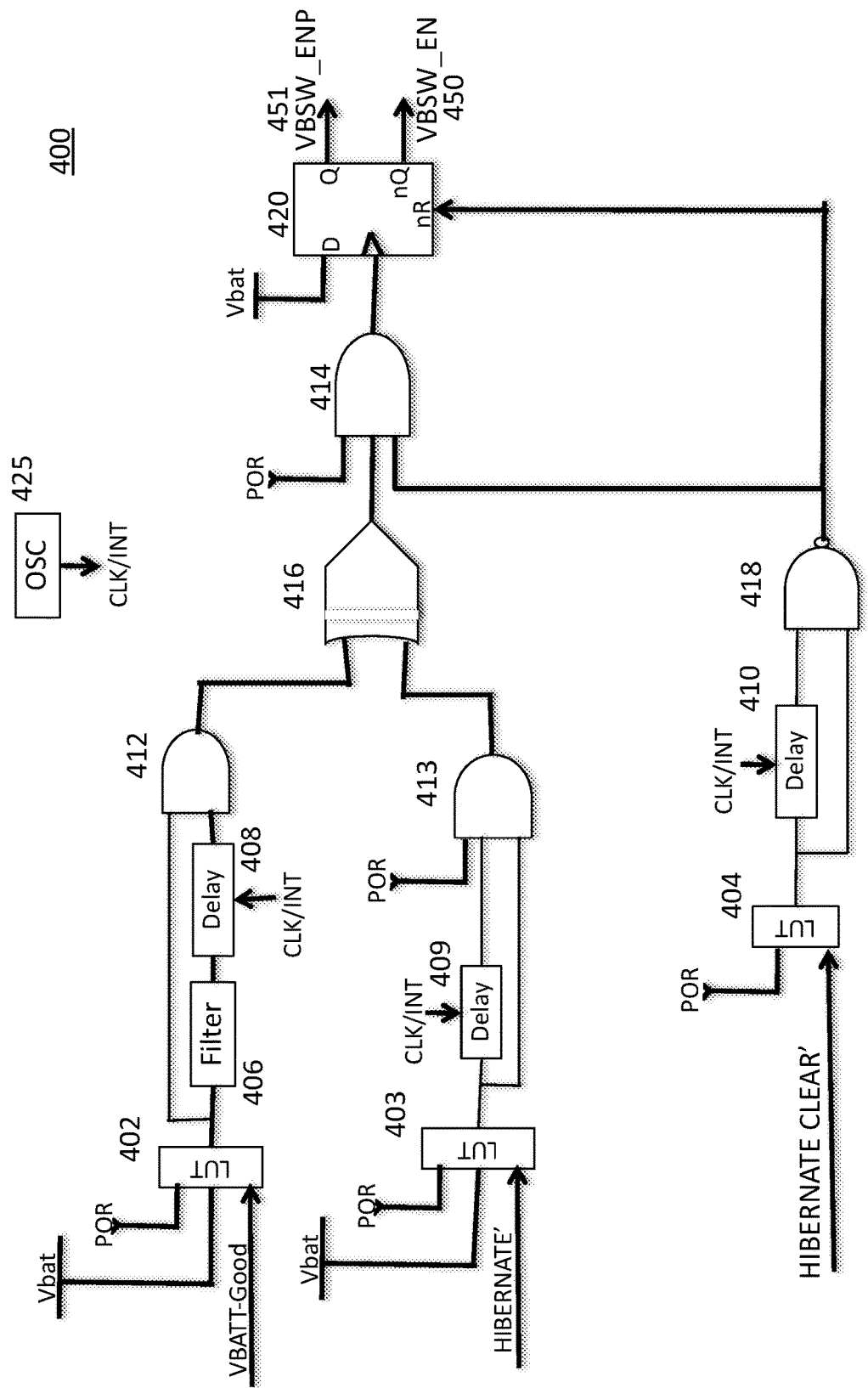
FIG. 4A is a schematic diagram of a hibernate control circuit with a battery condition sensing capability in accordance with an embodiment.
Figure 4B:
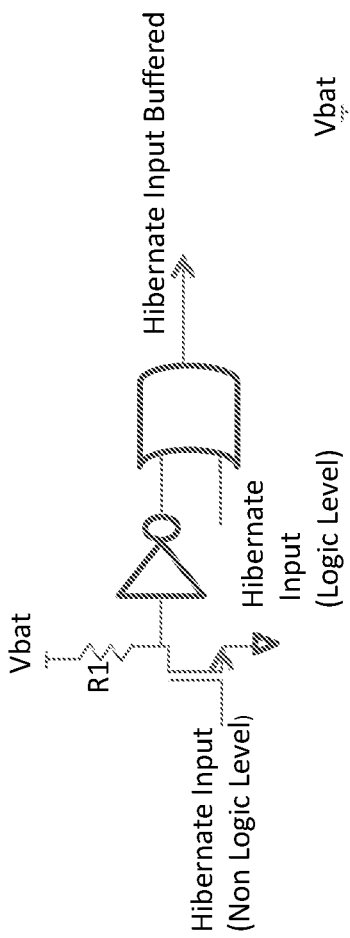
FIGS. 4B-4C are schematic diagrams of input signal receiving circuits.
Figure 4C:
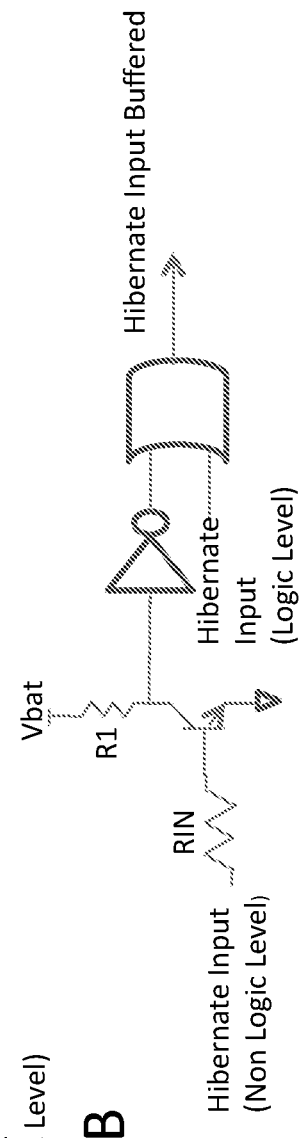

The sensing transistors 108,122 in the hibernate control circuits 100A, 100B, and 100C are shown and described as being an N-channel field effect transistor (NFET), such as shown in FIG. 4B. Other types of transistor switches can be used for the various sensing transistors (e.g., transistors 108,122), such as an NPN bipolar junction transistor (BJT) having a base (gate), collector (drain), and an emitter (source), with an input protection resistor coupled to the base such as shown in FIG. 4C. To refer to all types of transistor switches, the terminals around a transistor switch can be referred to as a control terminal (base, gate) to control the switch with a first pole (respectively collector, drain; or an emitter, source) and a second pole (respectively an emitter, source; or collector, drain) being what is selectively connected and disconnected in response to the logic level on the control terminal.

A number of hibernate control circuits in accordance with embodiments support a finite state machine model of operation, thereby allowing the battery switch enable control signal to be enabled by a microprocessor to bring circuits out of hibernation without reliance on connection and disconnection from a main power source. A hibernate clear signal can be used by a microprocessor to clear the hibernate state and allow battery switch enable to be generate to provide battery power to hibernatable circuits. A hibernate control circuit can include its own low frequency clock oscillator and counter that is programmable by the microcontroller to set an automatic wake up time from hibernation. The oscillator can generate a low frequency interrupt clock pulse to cause the battery switch enable signal to be generated and shared with a power switch.

Figure 3:
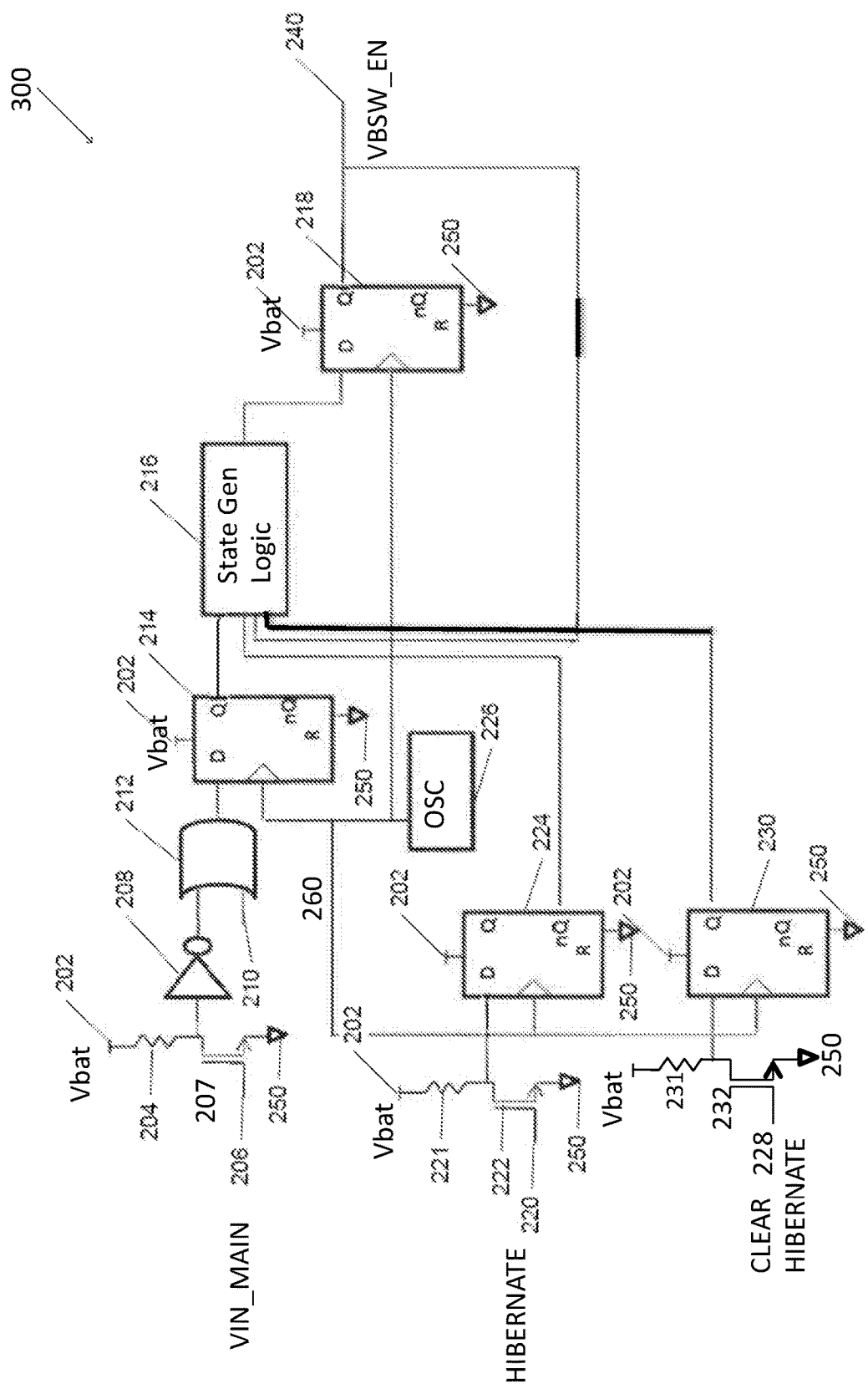
FIG. 3 is a schematic diagram of a hibernate control circuit with a self-clearing capability in accordance with an embodiment.

Referring now to FIG. 3, a schematic diagram of a hibernate control circuit 300 is shown receiving a clear hibernate (hibernate clear) signal input 228. The hibernate control circuit 300 further includes its own low frequency clock oscillator/counter/timer 226 that is programmable by a microcontroller to set an automatic wake up date/time to generate an interrupt clock pulse RTC_INT 210 (periodic wake signal). The interrupt clock pulse RTC_INT 210 can periodically wake the hibernatable circuits out of hibernation by providing battery power on the hibernatable power bus. Accordingly, the microcontroller itself or portions thereof can be a hibernatable circuit with battery power switched off by a power switch. Alternatively, the interrupt clock pulse RTC_INT can be coupled back to a microcontroller to wake it up out of a sleep mode if the microcontroller itself is not a hibernatable circuit that receives power through the power switch. The oscillator/counter 226 can also generate a low frequency clock pulse 260 that is coupled into the clock input of D flip flops 214,218,224,230 to clock in a D input value and generate a positive Q output and/or a negative Q (nQ) output in response thereto.

As shown in FIG. 3, the battery voltage Vbat 202 constantly provides battery power to active circuits (inverter 208, OR gate 212, state generation logic 216, oscillator 226 and D flip flops 214,218,224,230) in the hibernate control circuit 300 that are to remain powered on with battery power. Battery power is also coupled to one end of resistors 204,221,231 to constantly sense for input levels of the input signals (main voltage input (VIN_MAIN) 206, hibernate input control signal HIBERNATE 220, and clear hibernate input control signal CLEAR HIBERNATE 228) with transistors 207,222,232.

To sense for main voltage that may be switched on and off, the hibernate control circuit 300 includes a main voltage input 206 coupled to the gate of transistor 207. The source of transistor 207 is coupled to ground 250. The drain of transistor 207 is coupled to an opposite end of resistor 204 and an input of NOT gate (inverter) 208. The output of the NOT gate 208 is coupled to one input of the OR gate 212. The output of OR gate 212 is coupled into the D input of the D flip flop 214. Accordingly, when main voltage is sensed being provided, a logic low level is generated by transistor 207 on its drain and coupled into the input of the NOT gate 208. The NOT gate 208 inverts the low level at its input into a logic high level on its output. The logic high generated by the NOT gate is coupled into an input of the OR gate 212 to generate a logic high level at the output of the OR gate. The logic high level on the output of the OR gate 212 is coupled into the D input of the D flip flop 214 to change a cleared state to a set state at its Q output (wake control signal) when clocked by a clock signal 260 from the oscillator 226.

When main voltage goes away or is switched off, transistor 207 is switched off and the pull-up resistor 204 pulls up on the drain of the transistor 207 to the battery voltage Vbat. The input of the NOT gate 208 coupled to the drain follows being pulled up to the battery voltage Vbat. In this case, the NOT gate generates a logic low level at its output that is coupled into the input of the OR gate 212. The real time clock interrupt RTC_INT 210 is coupled to another input of OR gate 212. If both inputs of the OR gate 212 are logic low, the output of the OR gate 212 is a zero or a logic low level as well. The low logic level on the output of the OR gate 212 is coupled into the D input of the D flip flop 214 to change a set state at its Q output to a clear state when clocked by the clock signal 260 from the oscillator 226.

The real time clock interrupt RTC_INT 210 (periodic wake input signal) is coupled to the input of the OR gate 212 to also periodically provide power to the hibernating circuits when the external main power 206 is unavailable. The real time clock interrupt when logically high, causes the OR gate 212 to generate a logical high output that is coupled to the D input of the flip flop 214. When clocked by the low frequency clock signal 260 from the oscillator 226, a cleared state (logic low level or zero) changes to a set state (logic high state or one) at the Q output (wake control signal) of the D flip flop 214. The real time clock interrupt RTC_INT signal 210 can be based on the clock signal 260. A timer use the clock signal to count up to a value or count down to zero to generate the real time clock interrupt RTC_INT signal 210. Alternatively, a divider can be used to divide the frequency of the clock signal 260 down to a lower frequency in the generation of clock pulses.

To sense for a hibernate clear control signal, such as from a local microcontroller or external tester, a hibernate input control signal 220 is coupled to the gate of transistor 222. A second end of resistor 221 is coupled to the drain of transistor 222. The drain of transistor 222 is further coupled to the D input of the D flip-flop 224 to store the sensed state on the clock signal 260. The source of transistor 222 is coupled to ground 250 to drive the D input to ground when the transistor 222 is switched on. Otherwise when the transistor 222 is switched off, the pull-up resistor 221 pulls up on the D input of the D flip-flop 224 towards the battery voltage Vbat 202.

The hibernate input signal 228 is coupled into the D input of the D flip-flop 230 to store its state when clocked by the low frequency clock 260 from the oscillator 226. The Q output of the D flip flop 230 that stores a state of the hibernate signal is coupled into the reset input R of the D flip-flop 218. When the hibernate input signal is captured by the D flip flop, it resets the Q output, the battery switch enable control signal (VBSW_EN) 240, to logic zero. Accordingly, battery power is decoupled from the hibernatable circuits.

Outputs of flip flops 214,218,224 230 are coupled into the state logic block 216. In one embodiment, the Q outputs of flip flops 214,218,230 and the negative Q output (nQ) of flip flop 224 are coupled into the state logic block 216. In many embodiments, the state logic block 216 determines the state of the battery switch enable control signal (VBSW_EN) 240 at the Q output of the D flip flop 218. The inverse, negative or opposite polarity of the battery switch enable control signal, VBSW_ENP, can be generated by the nQ output of the D flip flop 281.

When a logic high, the battery switch enable control signal (VBSW_EN) 240 turns on the battery power switch into a wake mode to provide battery power to the hibernatable circuits. When a logic low level, the battery switch enable control signal (VBSW_EN) 240 turns off the battery power switch to disconnect power from the hibernatable circuits, referred to as a hibernate mode or state. In this manner, the hibernate control circuit 300 can selectively power on and power off the hibernatable circuits coupled to the battery power switch.

From an initial state of the battery switch enable control signal (VBSW_EN) 240, the state logic block 216 can calculate the next state of a finite state machine therein based on the registered state of the hibernate control signal input 220, the registered state of the main input voltage 206 or clock interrupt 210, and the registered state of the clear hibernate control signal input 228.

The battery switch enable control signal (VBSW_EN) 240 is an active high signal. The inverse or negative (VBSW_ENP) of the battery switch enable control signal (VBSW_EN) 240 at the nQ output of the D flip flop 218 can be referred to as a hibernate control output signal. When the battery switch enable control signal (VBSW_EN) 240 goes to a low logic level, the hibernate control output signal (VBSW_ENP) goes to a logic high level to send devices into the hibernate state. The hibernate control output signal can be coupled into any of a variety of other devices, such as processor and other devices as described below, to send or maintain those devices in a hibernate state.

Referring now to FIG. 4A, a hibernate control circuit 400 is shown without input sensing circuits for input control signals and the battery condition. Exemplary input sensing circuits are shown in FIGS. 3 and 4B-4D. Exemplary power switch circuits controlled by the battery switch enable signal (VBSW_EN) and/or its complement (inverse) are shown in FIGS. 4E-4F.

The hibernate control circuit 400 includes logic gates that can be instantiated by a programmable logic device to generate the battery switch enable signal (VBSW_EN) 450 and its complement, the negative battery switch enable signal (VBSW_ENP) 451. The battery switch enable signal (VBSW_EN) 450 and its complement, the negative battery switch enable signal (VBSW_ENP) 451, can be coupled to one or more gates of transistors in the power switch 470,480, such as shown in FIGS. 4E-4F. Either the battery power Vbat or the external main power (Vin_Main) can be multiplexed onto the hibernatable power bus that is coupled to the hibernatable circuits in the electronic device.

The hibernate control circuit 400 includes a plurality of look up tables 402-404 to provide logical conditioning of input signals. A power on reset signal (POR) is used by the hibernate control circuit 400 to gate out noise at power up. Until the POR reaches a logical high level, the input signals that may be noise are ignored. The POR signal is coupled into the plurality of look up tables 402-404, AND gate 413, and AND gate 414 that is used to generate a pulse signal to clock the D flip-flop 420.

The hibernate control circuit 400 further includes a debouncer/filter 406, delay stages 408-410, AND logic gates 412-413, and NAND logic gate 418 connected together as shown to debounce and filter out noise that might be mistaken for a valid input signal. The delay stages 408-410 can be programmable to set a minimal pulse width for a valid signal input. The delay stages 408-410 include D flip flops coupled in series that are clocked by the clock interrupt signal CLK/INT from the low frequency oscillator/counter 425. The debouncer/filter 406 can be a pair of resistor-transistor (RT) inverters coupled in series with a passive RC delay. The debouncer/filter 406 can be a series of N D type flip flops (D input tied high to form toggle flip flops) with the buffered input signal coupled into the first clock input and the first Q output coupled to the next clock input and so on, with the first input and each Q output being logically ANDed together by an N+1 AND gate to generate the debounced signal output. Alternatively the debouncer/filter 406 can be a series of N odd positive clocked D type flip flops and even negative clocked D type flip flops with the buffered input signal coupled into the first D input and the first Q output coupled into the next D input and so on and so forth, with the first D input and each Q output being logically ANDed together by an N+1 AND gate to generate the debounced signal output.

The look up table 404, delay 410, and AND gate 418 logically condition, and debounce the input signal HIBERNATE CLEAR' to be sure a valid hibernate clear input signal (active low) was received. The look up table 404 logically generates a high output level when the POR signal is high and the HIBERNATE CLEAR' is low. The output from the look up table 404 is coupled into an input of the NAND gate 418 and an input of the delay circuit 410 to be sure it has a certain pulse width. The delayed output out of the look up table 404 is coupled into the second input of the NAND gate 418. When both signals that are logical high reach the input of the NAND gate 418, the NAND gate 418 generates a logic low level.

The output of NAND gate 418 is coupled into the negative reset (nR) input of the D flip-flop 420, an active low input. When the output of the output of NAND gate 418 goes logically low, the D flip flop 420 is reset so that the battery switch enable signal 450 is logically high, allowing battery power to flow through the power switch to the hibernatable circuits. In this manner, the active low HIBERNATE CLEAR' input signal can clear the hibernate mode and allow the hibernatable circuits to receive power.

Assuming the battery switch enable signal 450 is logically high and the hibernatable circuits are receiving battery power over a battery power supply bus, the good battery voltage input signal (VBATT-Good) no longer being available indicating a low battery condition, can cause the hibernate control circuit 400 to disable the generation of the battery switch enable signal 450 and send the hibernatable circuits into hibernate mode with battery power being switched off.

The look up table 402, filter 406, delay 408, and AND gate 412 logically condition, debounce and filter out noise to sense the battery condition and generate a valid good battery voltage input signal (VBATT-Good). The good battery voltage input signal (VBATT-Good) allows the battery switch enable signal 450 to be continually generated until the battery condition changes to a weak state or is overridden by the hibernate input signal being asserted active low.

The look up table 402 logically generates a high output level when the POR signal is high, and the VBATT-Good is low. The output from the look up table 402 is coupled into an input of the AND gate 412 and an input of the filter 406 to be sure noise removed. The output of the filter 406 is coupled into the input of the delay circuit 408 to be sure the signal has a minimal pulse width. The delayed/filtered output out of the look up table 402 is coupled into the second input of the AND gate 412. When both signals, that are logical high indicating a low battery, reach the inputs of the AND gate 412, the AND gate 412 generates a high logic level output indicating a valid low battery signal. The output of the AND gate 412 transitioning from a low to high level can be used clock the D input into the D flip flop 420.

The logic high level pulse output from AND gate 412 representing a valid low battery signal is passed through the OR gate 416 and coupled into an input of the AND gate 414. The POR level is a logic high level after power up and is coupled into another input of the AND gate 414. Without the HIBERNATE CLEAR' signal being asserted, the output of the NAND gate 418 is a high logic level that is coupled into a third input of the AND gate. Accordingly, the valid low battery signal (the negative or opposite of a good battery signal) output by the AND gate 412 can cause the D flip flop 420 to clock in and store a logical high due to the D input being coupled to the battery voltage. Accordingly, the battery switch enable signal 450 changes from a logical high to a logical low, a hibernate mode, such that the power switch is selected to remove battery power from the hibernatable circuits.

Alternatively, assuming the battery switch enable signal 450 is logically high and the hibernatable circuits are receiving battery power, the HIBERNATE' input signal can also cause the hibernate control circuit 400 to disable the generation of the battery switch enable signal 450 and send the hibernatable circuits into hibernate mode with battery power being switched off.

The look up table 403, delay 409, and AND gate 413 logically condition, and debounce the active low input signal HIBERNATE' to be sure a valid hibernate input signal was received. The look up table 403 logically generates a high output level when the POR signal is high, and the active low HIBERNATE' input signal is logically low. The output from the look up table 403 is coupled into an input of the AND gate 413 and an input of the delay circuit 409 to debounce/remove noise and be sure the signal has a minimal pulse width. The delayed output out of the look up table 403 is coupled into a second input of the AND gate 413. The POR signal is a logic high level after power up and is coupled into a third input of the AND gate 413. When both signals are logical high, indicating a hibernate signal, and reach the inputs of the AND gate 413, the AND gate 413 generates a high logic level indicating a valid hibernate signal. The output of the AND gate 413 transitioning from a low to high level can be used clock the D input into the D flip flop 420.

The logic high level pulse output from AND gate 413 representing a valid hibernate signal is passed through the OR gate 416 and coupled into an input of the AND gate 414. The POR level is a logic high level after power up and is coupled into another input of the AND gate 414. Without the HIBERNATE CLEAR' signal being asserted, the output of the NAND gate 418 is a high logic level that is coupled into a third input of the AND gate. Accordingly, the valid hibernate signal (the opposite of a wake signal) output by the AND gate 413 can cause the D flip flop 420 to clock in and store a logical high due to the D input being coupled to the battery voltage. Accordingly, the battery switch enable signal 450 changes from a logical high to a logical low, a hibernate mode, such that the power switch is selected to remove battery power from the hibernatable circuits.

Once in the hibernate mode, the state of the D flip flop 420 is not changed from a hibernate mode until a valid HIBERNATE CLEAR' input signal is received, to regenerate the battery switch enable signal and allow the power switch to send battery power to the hibernatable circuits. The active low HIBERNATE CLEAR' signal can be generated by one or more control signals.

Figure 4D:
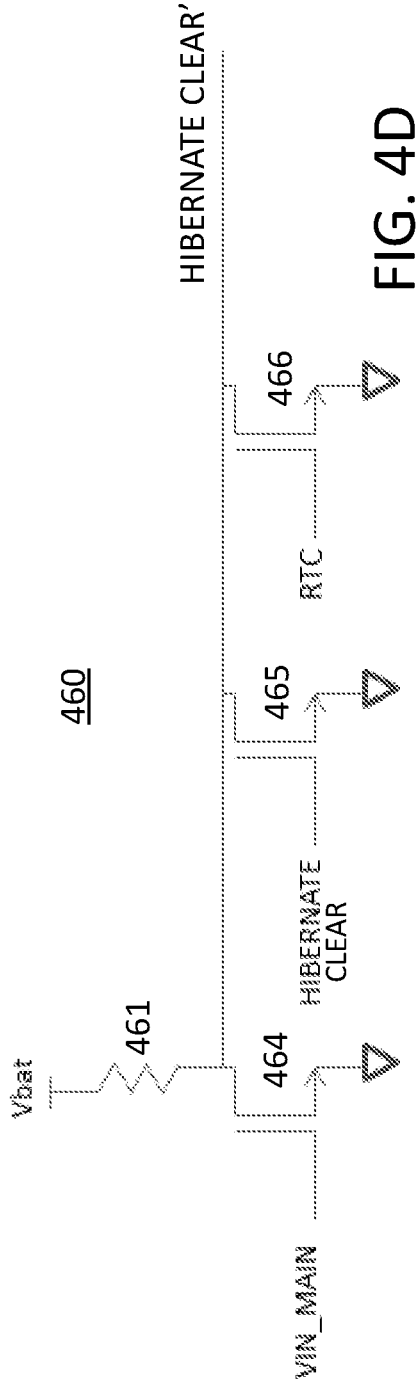
FIG. 4D is a schematic diagram of a hibernate clear circuit with multiple input signals capable of generating a hibernate clear input signal.
Figure 4E:
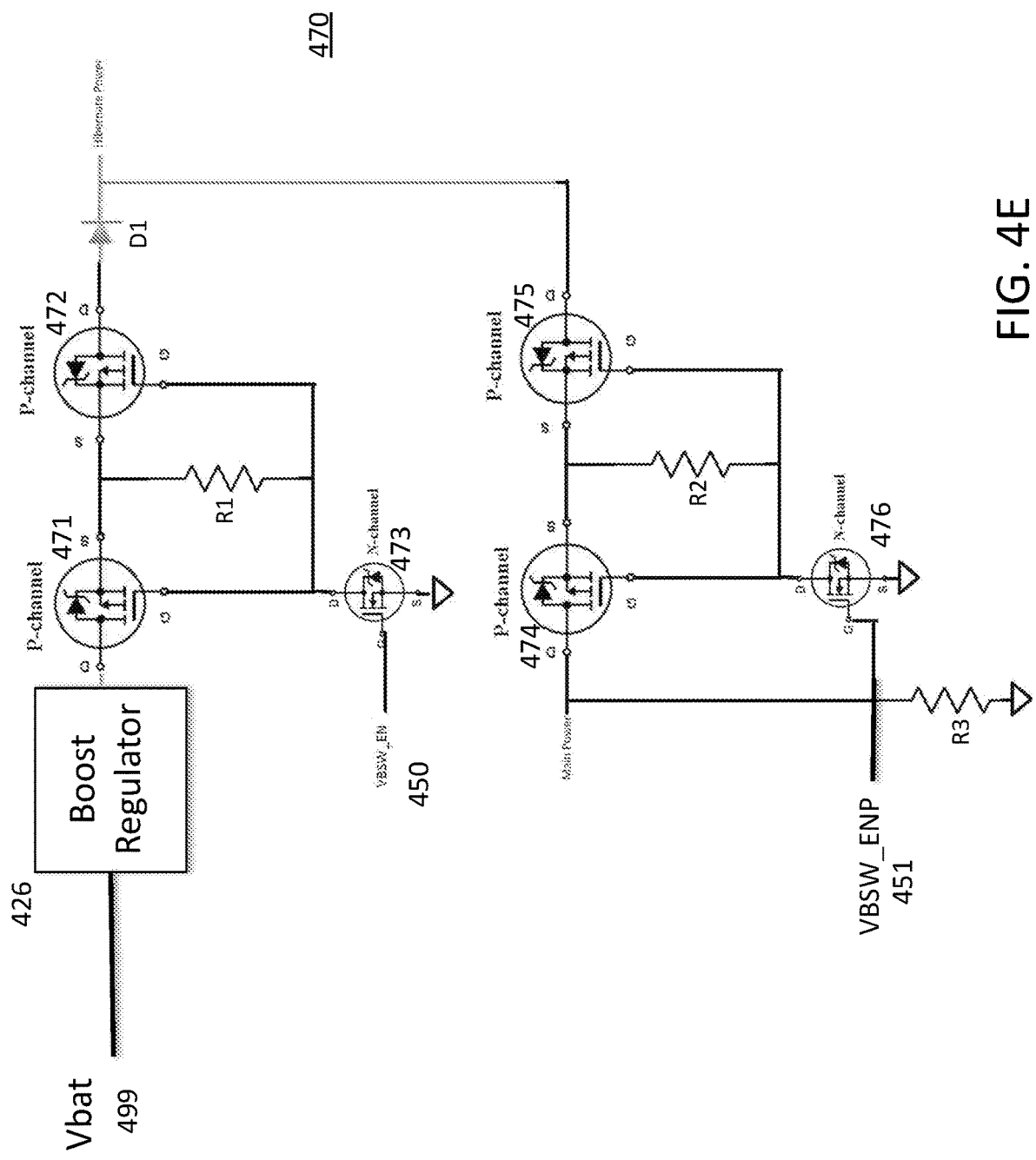
FIGS. 4E-4F are schematic diagrams of alternate power multiplexing or battery power switching circuits.
Figure 4F:
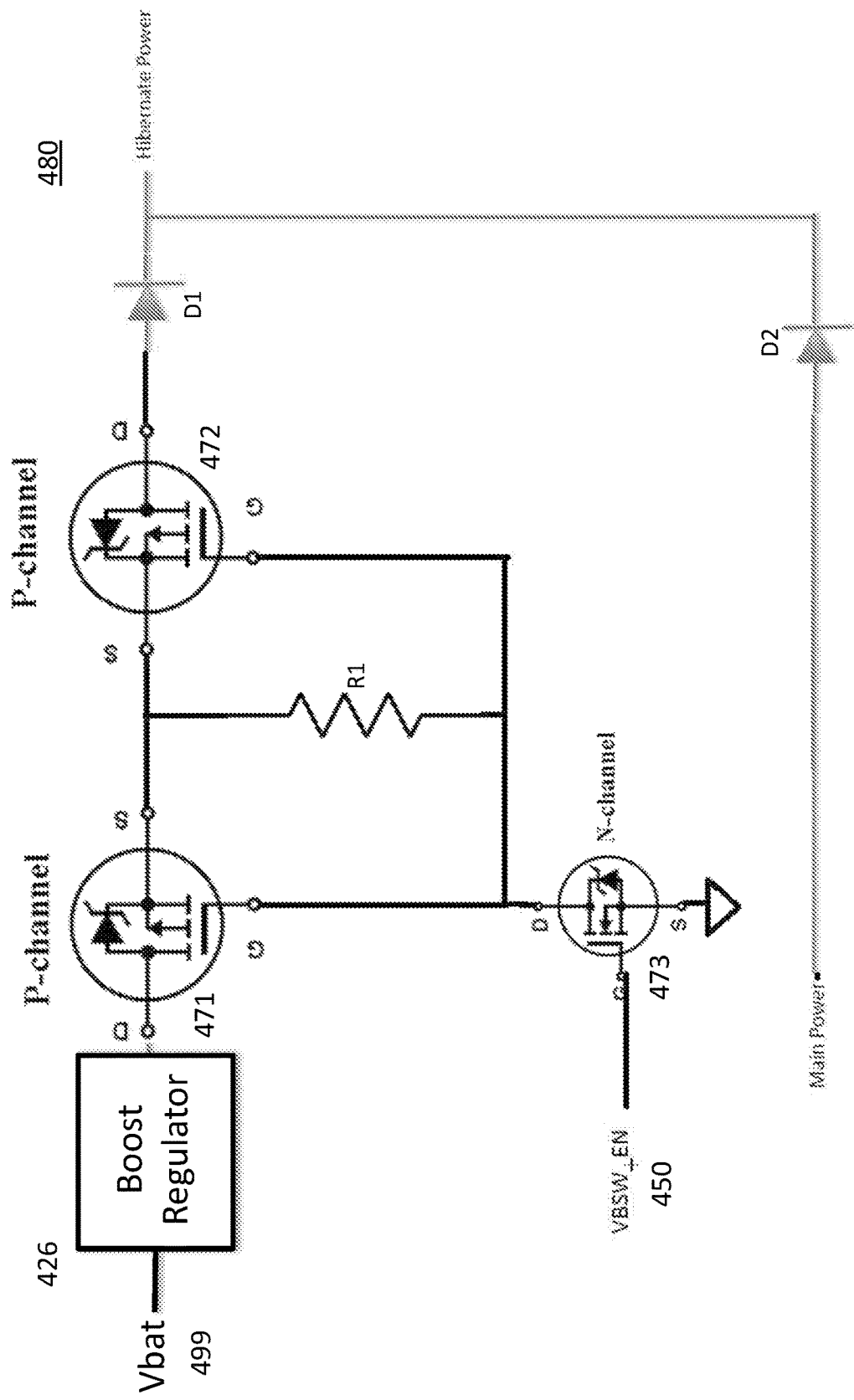

Referring now to FIG. 4D, a schematic diagram of a hibernate clear logic circuit 460 is shown. The hibernate clear logic circuit 460 receives a plurality of active high control signals (e.g., VIN_MAIN, HIBERNATE CLEAR, RTC or CLK/INT) and generates the active low HIBERNATE CLEAR' control signal. The hibernate clear logic circuit 460 includes a pull up resistor 461 coupled between the battery power supply Vbat and the output node HIBERNATE CLEAR'. The hibernate clear logic circuit 460 further includes a plurality of transistors 464-466 having gate inputs coupled to respective active high input signals (e.g., VIN-MAIN, HIBERNATE CLEAR, RTC) effectively forming a wired OR configuration. The sources of the transistors are coupled to ground, while the drains of the transistors are coupled to the output node HIBERNATE CLEAR'.

If any one of the input signals goes active high, the respective transistor is turned on and pulls down on the output node HIBERNATE CLEAR'. The output node HIBERNATE CLEAR' can be coupled into an input of the LUT 404 shown in FIG. 4A. If an active HIBERNATE CLEAR is generated by a micro-controller or an external controller, such as a tester, the active low HIBERNATE CLEAR' is generated to cause the battery switch enable to provide battery power to the hibernatable circuits. If the external main voltage is provided or turned on, it can alternatively generate the active low HIBERNATE CLEAR' to cause the battery switch enable to provide battery power to the hibernatable circuits. If a periodic clock signal RTC is generated by the oscillator/counter, it can alternatively generate the active low HIBERNATE CLEAR' to cause the battery switch enable to provide battery power to the hibernatable circuits.

Although specific embodiments of hibernate control circuits are described above with respect to FIGS. 2A-2C, 3, and 4A-4E, it should be noted that a variety of other designs can be employed in accordance with embodiments. For example, in the hibernate control circuit 300, inverter 208 and OR gate 212 can be similarly substituted for different Boolean logic gates as discussed with reference to FIGS. 2A-2B. Furthermore, in a number of the illustrated embodiments (not FIG. 4C), the transistors are shown as field effect transistors; however, any of a variety of transistors can be utilized as appropriate to the requirements of specific applications of embodiments. Additionally, the illustrated embodiments include D flip-flops, but it should be noted that any data storage element, such as a latch or a SR flip-flop, or combination of data storage elements can be utilized as appropriate to the requirements of specific applications of embodiments. It should be noted that hibernate control circuits can operate at any voltage (such as 1.4V, 3.3V, 5V, 9V, or 12V) or range of voltages, as appropriate to the requirements of specific applications of embodiments. Any source of ground, such as a chassis ground or a ground provided by an external device, can be utilized as appropriate to the requirements of specific applications of embodiments.

Battery Power Switching Circuits

Referring now to FIG. 4E, a battery power switching circuit or power multiplexing circuit 470 is illustrated. In response to the battery switch enable VBSW_EN control signal 450 and the negative battery switch enable VBSW_ENP control signal 451, the circuit 470 selectively multiplexes battery power Vbat or main power from their respective power supply busses onto the hibernatable power bus for the hibernatable circuits.

For multiplexing main power onto the hibernatable power bus, the circuit 470 includes p-channel transistors 474-475, n-channel transistor 476, and resistors R2-R3 coupled together as shown. The negative or prime battery switch enable control signal VBSW_ENP 451 is coupled to the gate of the N-channel transistor 476.

P-channel transistors 474-475 act in concert together as a transfer gate when switched on to selectively transfer main power, when available, to the hibernatable power bus. P-channel transistors 474-475 have source terminals coupled in series together and their gates coupled together to a control node. The drain of P-channel transistor 474 couples to the main power supply input. The drain of P-channel transistor 475 couples to the hibernatable power bus.

N channel transistor 476 acts as a control input inverter with its gate coupled to the negative or prime battery switch enable control signal VBSW_ENP 451, its source coupled to ground, and its drain terminal coupled together to the control node and the gates of the P-channel transistors 474-475.

Resistor R2 has one terminal coupled to the control node, the gates of transistors 474-475, and the drain of transistor 476. The opposite terminal of resistor R2 is coupled to the sources of the P-channel transistors 474-475. Resistor R2 acts like a pull up resistor on the control node when main power is supplied and multiplexed onto the hibernatable power bus.

Resistor R3 acts as a pull down resistor with one terminal end coupled ground and the opposite terminal coupled to the main power supply input. When main power supply is turned off, the resistor R3 pulls down on the main power supply until it reaches zero volts.

Assume main power is available to be multiplexed onto the hibernatable power bus. When the negative battery switch enable control signal VBSW_ENP 451 is high, N-channel transistor 476 is turned on pulling the control node towards ground. When the voltage on the control node coupled to the gates of the P-channel transistors 474-475 reaches a transistor threshold voltage below the main power supply voltage, P-channel transistors 474-475 turn on to transfer the main power supply to the hibernatable power bus.

When the negative battery switch enable control signal VBSW_ENP 451 goes low and reaches a voltage level at or below the transistor threshold voltage of the N channel transistor 476, transistor 476 turns off and allows resistor R2 to pull up on the control node to the gates of the P-channel transistors 474-475. When the control node coupled to the gates of the P-channel transistors 474-475 is pulled up to a voltage level equal to a transistor threshold voltage below the main power supply voltage, the P-channel transistors 474-475 turn off and the main power supply is isolated from the hibernatable power bus. With the series connection of the P channel transistors 474-475 and the resistor R2 coupled between gates and sources of the P-channel transistors and the negative battery switch enable control signal VBSW_ENP 451 being logic low, current flow is blocked from the hibernatable power bus to the main power bus.

For multiplexing battery power onto the hibernatable power bus, the circuit 470 includes p-channel transistors 471-472, n-channel transistor 473, resistor R1, and diode D1 coupled together as shown. The active high battery switch enable control signal VBSW_EN 450 is coupled to the gate of the N-channel transistor 473 to selectively multiplex the battery power Vbat onto the hibernatable power bus.

Diode D1 is coupled between the hibernatable power bus and the p-channel transistor 472 to protect the battery from a potential larger voltage source (unregulated) of the main power. The diode D1 has its anode coupled to the drain of transistor 472 and its cathode coupled to the hibernatable power bus.

P-channel transistors 471-472 act in concert together as a transfer gate when switched on to selectively transfer battery power, when available, to the hibernatable power bus. P-channel transistors 471-472 have source terminals coupled in series together and their gates coupled together to another control node. The drain of P-channel transistor 471 couples to the battery supply input Vbatt. The drain of P-channel transistor 472 couples to the anode of the diode D1.

Resistor R1 has one terminal coupled to the control node, the gates of transistors 471-472, and the drain of transistor 473. The opposite terminal of resistor R1 is coupled to the sources of the P-channel transistors 471-472. Resistor R1 acts like a pull up resistor on the control node when the battery power is selectively supplied and multiplexed onto the hibernatable power bus.

N channel transistor 473 acts as a control input inverter with its gate coupled to the battery switch enable control signal VBSW_EN 450. The source of transistor 473 is coupled to ground, and its drain terminal is coupled together to the control node and the gates of the P-channel transistors 471-472.

Assume battery power Vbatt is available to be multiplexed onto the hibernatable power bus. When the battery switch enable control signal VBSW_EN 450 is high, N-channel transistor 473 is turned on pulling the control node coupled to its drain towards ground. When the voltage on the control node coupled to the gates of the P-channel transistors 471-472 reaches a transistor threshold voltage below the battery power supply voltage, P-channel transistors 471-472 turn on to transfer the battery power towards the anode of the diode D1. Assuming the hibernatable power bus is a lower voltage such as zero volts, the battery voltage at the anode forward biases the diode D1 to turn on and allow the flow of current from the battery into the hibernatable power bus. The hibernatable power bus is provided with a voltage of the battery less the forward voltage diode drop across diode D1.

When the battery switch enable control signal VBSW_EN 450 goes low and reaches a voltage level at or below the transistor threshold voltage of the N channel transistor 473, transistor 473 turns off and allows resistor R1 to pull up on the control node coupled to the gates of the P-channel transistors 471-472. When the control node coupled to the gates of the P-channel transistors 471-472 is pulled up to a voltage level equal to a transistor threshold voltage below the battery power supply voltage, the P-channel transistors 471-472 turn off and the battery is isolated from the hibernatable power bus. Diode D1, when reversed biased, blocks reverse current flow from the hibernatable power bus to the battery. The configuration of the P channel transistors 471-472 and the resistor R1 coupled between gates and sources of the P-channel transistors also deters reverse current flow from the hibernatable power bus to the battery when the battery switch enable control signal VBSW_EN 451 is logic low.

Referring now to FIG. 4F, a battery power switching circuit or power multiplexing circuit 480 is illustrated. In response to the battery switch enable VBSW_EN control signal 450, the circuit 480 multiplexes battery power Vbatt and main power onto the hibernatable power bus for the hibernatable circuits. The circuit 480 show in FIG. 4F is simpler than the circuit 470 shown in FIG. 4E.

The circuit for selectively multiplexing battery power onto the hibernatable power bus is identical. The circuit 480 includes p-channel transistors 471-472, n-channel transistor 473, resistor R1, and diode D1 coupled together as shown. The active high battery switch enable control signal VBSW_EN 450 is coupled to the gate of the N-channel transistor 473 to selectively multiplex the battery power into the hibernatable power bus. The function of this circuitry is identical as well, is incorporated here by reference, and not repeated for brevity.

For multiplexing main power onto the hibernatable power bus, the circuit 480 includes a diode D2 coupled between main power and the hibernatable power bus. The diode D2 has its anode coupled to the main power bus and its cathode coupled to the hibernatable power bus. Assuming the hibernatable power bus is at a lower voltage such as zero volts and the main power supply is switched on, when the main power supply voltage on the anode forward biases the diode D2 to turn on it allows the flow of current from the main power into the hibernatable power bus. The hibernatable power bus is provided with a voltage of the main power supply less the forward voltage diode drop across diode D2.

Diode D1 in the circuit can become reverse biased when the voltage on the hibernatable power bus becomes greater than the voltage provided by battery power supply Vbatt. When diode D1 is reversed biased, it blocks reverse current flow from the hibernatable power bus to the battery. The battery, if rechargeable, is preferably charged by a regulated voltage source, such as that which can be provided by a voltage regulator coupled to the main power supply (e.g., see power regulator 28 shown in FIG. 1).

Vehicle Telematics Devices

One application of hibernate control circuits is in vehicle telematics devices. As described above, hibernate control circuits can be utilized to keep vehicle telematics devices in an ultra-low power state until they are installed in a vehicle. This can be particularly useful for those vehicle telematics devices with a fixed battery, where the reduced power consumption of the hibernate control circuit can allow for an extended lifespan for the device.

Figure 5:
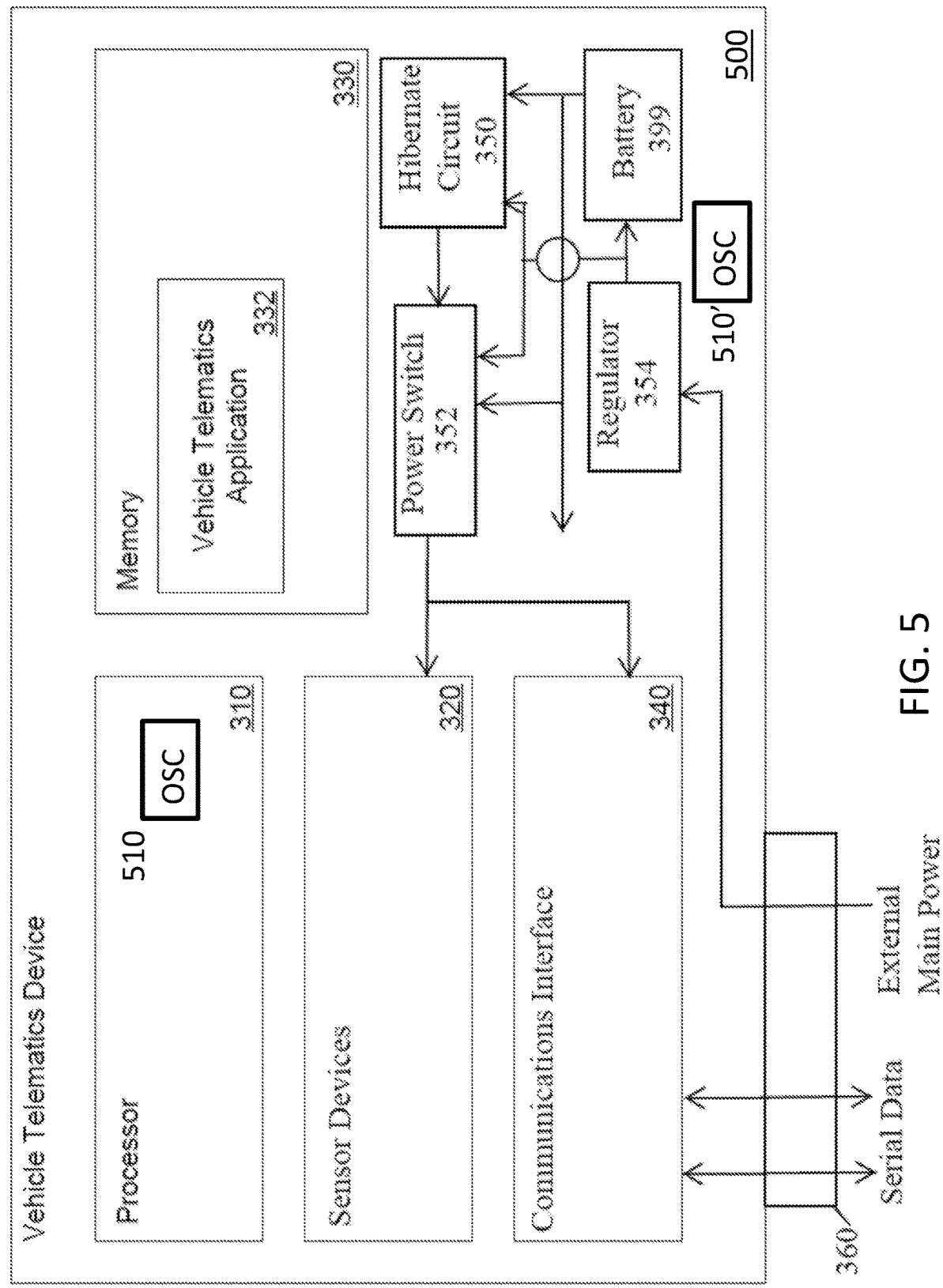
FIG. 5 is a conceptual illustration of a vehicle telematics device in accordance with an embodiment.

Referring now to FIG. 5, a conceptual illustration of a vehicle telematics device 500 is shown. The vehicle telematics device 500 is installed in a vehicle to track the location of the vehicle and provide other vehicle telematics applications.

The vehicle telematics device 500 can couple to a vehicle data bus through a connector 360 (e.g., an on board diagnostic (OBD) II connector) and a communications interface 340. The vehicle data bus can provide vehicle data (e.g., vehicle velocity, engine RPM) to the vehicle telematics device 500 over serial data lines when the vehicle is operational. The vehicle data bus often includes one or more lines (an external main power line) of a power supply (e.g., remote vehicle battery) to which the connector 360 can couple. The external main power is coupled to a regulator 354 of the telematics device 500. The connector 360 can also be used for testing of the vehicle telematics device 500 with a tester providing power through the power line and data/control signals through the serial data lines.

The external main power can be selectively be powered on or powered off, such as through an ignition switch of the vehicle. The vehicle telematics device 500 includes a local battery 399. When the vehicle is turned off, the circuits of the vehicle telematics device 500 can operate with battery power from the local battery 399 (e.g., 3 or 5 volts) which can have a different voltage than the voltage (e.g., 12 volts) of the remote vehicle battery. A regulator 354 can regulate the voltage of the remote vehicle battery down to that voltage for operation of the circuits of the telematics device 500. The battery 399 can be a rechargeable battery. In this case, the regulator 354 can also regulate the voltage of the remote vehicle battery down towards the battery voltage to recharge it.

The vehicle telematics device 500 includes a hibernate control circuit 350 and the battery 399, but can receive main power from the vehicle data bus that is selectively provided when the vehicle is turned on. In this case, the circuits of the vehicle telematics device 500 can operate from main power. Selectively, such as when the external main power is unavailable, the hibernate control circuit 350 can cause the battery power from the battery 399 to be selectively switched off by a power switch 352 to one or more circuits or portions thereof in the vehicle telematics device 500. For example, one or more radios of the communications interface 340 and one or more sensors of a plurality of sensor devices 320 can have their power supply disconnected to reduce power consumption from the battery 399 when the external power is unavailable. A hibernate signal (the opposite or inverse of a battery switch enable signal) can be generated by the hibernate control circuit 350 to control the power switch 352 to disconnect battery power from hibernatable circuits in the telematics device.

The vehicle telematics device 500 includes a processor or micro-controller 310 in communication with memory 330. The vehicle telematics device 500 can also include one or more communication interfaces 340 with a plurality of radios and transceivers capable of sending and receiving data in various ways (wired, wireless). In a number of embodiments, the communication interface 340 is in communication with the processor 310, the memory 330, sensor device(s) 320, and/or the hibernate control circuit 350.

The hibernate control circuit 350 can be utilized to help keep the vehicle telematics device 500 in an ultra-low power state, such as when it is in inventory waiting to be installed into a vehicle, or installed in a vehicle that is powered off In many embodiments, the processor 310 and/or an external interface of the communications interface 340, can be utilized to provide one or more control signals to control the operation of the hibernate control circuit 350. The internal processor 310 or an external device coupled to the communications interface 340 can cause the hibernate control circuit 350 to generate a hibernate control signal. Alternatively, when installed, sensing the lack of external main power can cause the hibernate control circuit 350 to generate the hibernate control signal. The hibernate control signal can be turned off by commands to the hibernate control circuit 350 to selectively switch on battery power to the hibernatable circuits. A hibernate clear signal can be periodically generated by a low frequency clock/counter 510 in the micro-controller 510 and coupled into the hibernate control circuit 350. Alternatively, an external low power low frequency clock generator/counter 510' in the device 500 can be periodically generate a hibernate clear signal and coupled into the hibernate control circuit 350 so that power is provided to the hibernatable circuits. After a short period of time, the hibernatable circuits can be sent back into a hibernation mode by the hibernate control circuit.

In several embodiments, the memory 330 is any form of storage configured to store a variety of data, including, but not limited to, a vehicle telematics application 332. In many embodiments, the vehicle telematics application 332 is stored using an external server system and received by the vehicle telematics device 500 using the communications interface 340. Sensor devices 320 can include RPM sensors, voltage sensors, power sensors, GPS receivers, noise sensors, vibration sensors, acceleration sensors, weight sensors, and any other device capable of measuring data regarding a vehicle as appropriate to the requirements of specific applications of embodiments, one or more of which can be a hibernatable circuit. Sensor devices 320 are typically included within the vehicle telematics device 500 but can also be located external to the vehicle telematics device 500 coupled into communication with the processor 310. The vehicle telematics 500 can communicate with external sensor devices using the communications interface 340, such as via a vehicle data bus, I/O interface (including serial interfaces), mobile communications device (e.g., radios associated with a cellular telephone), and/or a network connection as appropriate to the requirements of specific applications of embodiments. In a variety of embodiments, the vehicle telematics device 500 is connected to a diagnostic connector (e.g., an OBD II port) in a vehicle. In a variety of embodiments, the processor 310 can be directed, by the vehicle telematics application 332, to control the operation of the hibernate control circuit 350.

Specific architectures for vehicle telematics devices in accordance with embodiments are conceptually illustrated in FIG. 5; however, any of a variety of architectures, including those that store data or applications on disk or some other form of storage and are loaded into memory at runtime, can also be utilized. In particular, it should be noted that while the illustrated embodiment includes a separate processor and hibernate control circuit, many embodiments include a hibernate control circuit implemented using the processor. In a variety of embodiments, a memory includes circuitry such as, but not limited to, memory cells constructed using transistors, that are configured to store instructions. Similarly, a processor can include logic gates formed from transistors (or any other device) that dynamically perform actions based on the instructions stored in the memory. In several embodiments, the instructions are embodied in a configuration of logic gates within the processor to implement and/or perform actions described by the instructions. In this way, the systems and methods described herein can be performed utilizing both general-purpose computing hardware and by single-purpose devices.

Objects, advantages and novel features of the embodiments set forth in the detailed description will become apparent to those skilled in the art upon review, or learned by practice.

Although the embodiments have been described in certain specific aspects, many additional modifications and variations would be apparent to those skilled in the art. In particular, any of the various processes described above can be performed in alternative sequences and/or in parallel in order to achieve similar results in a manner that is more appropriate to the requirements of a specific application. It is therefore to be understood that the embodiments disclosed can be practiced otherwise than specifically described without departing from the scope and spirit of the present invention. Thus, the embodiments should be considered in all respects as illustrative and not restrictive. It will be evident to the person skilled in the art to freely combine several or all of the embodiments discussed here as deemed suitable for a specific application. Throughout this disclosure, terms like "advantageous", "exemplary" or "preferred" indicate elements or dimensions which are particularly suitable (but not essential) to an embodiment, and may be modified wherever deemed suitable by the skilled person, except where expressly required. Accordingly, the scope of the embodiments should be determined, not by the embodiments illustrated, but by the appended claims and their equivalents.

The invention claimed is:

1. A vehicle telematics device comprising:
   a connector configured to mate with a corresponding connector of a vehicle, wherein the connector includes a main power terminal to receive main power from a main battery of the vehicle;
   a local battery internal to the vehicle telematics device and configured to supply battery power;
   a power switch coupled to the main power terminal, the local battery, and a power bus of the vehicle telematics device, wherein the power switch is controllable to selectively supply and remove the battery power from the local battery to the power bus while the main power is unavailable;

a hibernatable circuit coupled to the power bus to receive power therefrom; and a hibernate control circuit coupled to the power switch and configured to control, in response to receipt of a command signal, the power switch to (i) supply the battery power from the local battery to the power bus or (ii) remove the battery power from the power bus, wherein removal of the battery power from the power bus, while the main power is unavailable, causes the hibernatable circuit to enter a low power state in which the hibernatable circuit draws less power than when the hibernatable circuit is not in the low power state.

2. The vehicle telematics device of claim 1, wherein the hibernatable circuit is configured to perform a function and wherein the hibernate control circuit is configured to control the power switch, while the main power is unavailable, to (i) supply the battery power to the power bus to cause the hibernatable circuit to exit the low power state and perform the function and (ii) remove the battery power from the power bus to cause the hibernatable circuit to enter the low power state in response to a determination that the hibernatable circuit has performed the function.

3. The vehicle telematics device of claim 1, further comprising a non-hibernatable circuit configured to send the command signal to the hibernate control circuit to cause the hibernate control circuit to control the power switch to supply the battery power to the power bus to cause the hibernatable circuit to exit the low power state.

4. The vehicle telematics device of claim 1, wherein the command signal is a periodic command signal based on a clock signal and is periodically received by the hibernate control circuit, wherein the periodic command signal is configured to cause the hibernate control circuit to periodically supply and remove the battery power to the power bus.

5. The vehicle telematics device of claim 4, further comprising a processor configured to generate the periodic command signal based on a clock signal generated by the processor.

6. The vehicle telematics device of claim 5, wherein the processor is configured to control the clock signal to adjust a period of the periodic command signal.

7. The vehicle telematics device of claim 1, further comprising a processor configured to perform a function and, in response to completion of the function, to send the command signal to the hibernate control circuit to control the power switch to remove the battery power from the power bus to cause the hibernatable circuit to enter the low power state.

8. The vehicle telematics device of claim 1, wherein the hibernatable circuit comprises a processor, and the processor is configured to send the command signal to the hibernate control circuit to control the power switch to remove the battery power from the power bus to cause the processor to enter the low power state.

9. The vehicle telematics device of claim 8, wherein the processor is further configured to program a counter to generate an additional command signal to the hibernate control circuit to control the power switch to supply the battery power to the power bus to cause the processor to exit the low power state upon expiration of the counter.

10. The vehicle telematics device of claim 1, further comprising a non-hibernatable circuit coupled to the local battery via a power bus different from the power bus controlled by the power switch, wherein the non-hibernatable circuit is configured to receive power from the local battery while the hibernatable circuit is in the low power state.

11. A method for controlling battery power supplied by a local battery of a vehicle telematics device of a vehicle, the method comprising:

receiving, by the vehicle telematics device, main power from a main battery of the vehicle via a main power terminal of a connector of the vehicle telematics device that is configured to mate with a corresponding connector of the vehicle;

receiving, by a power switch of the vehicle telematics device, a battery power from the local battery, wherein the power switch is controllable to selectively supply and remove the battery power to a power bus of the vehicle telematics device;

controlling, by a hibernate control circuit of the vehicle telematics device and in response to receipt of an enable hibernate command signal while the main power is unavailable, the power switch to remove the battery power from the power bus to cause a hibernatable circuit of the vehicle telematics device coupled to the power bus to enter a low power state in which the hibernatable circuit draws less power than when the hibernatable circuit is not in the low power state; and controlling, by the hibernate control circuit and in response to receipt of a disable hibernate command signal while the main power is unavailable, the power switch to supply the battery power to the power bus to cause the hibernatable circuit to exit the low power state.

12. The method of claim 11, further comprising performing, by the hibernatable circuit, a function, wherein controlling the power switch to supply the battery power to the power bus comprises controlling, by the hibernatable circuit and in response to the disable hibernate command signal, the power switch to cause the hibernatable circuit to exit the low power state and perform the function, and wherein controlling the power switch to remove the battery power from power bus comprises controlling, by the hibernate control circuit and in response to receipt of the enable hibernate command signal, the power switch to remove the battery power from the power bus to cause a hibernatable circuit to enter a lower power state in response to a determination that the hibernatable circuit has performed the function.

13. The method of claim 11, further comprising sending, by a non-hibernatable circuit of the vehicle telematics device, the disable hibernate command signal to the hibernate control circuit while the main power is unavailable.

14. The method of claim 11, further comprising periodically receiving, by the hibernate control circuit, the enable hibernate command signal and the disable hibernate command signal.

15. The method of claim 14, further comprising:

generating, by a processor of the vehicle telematics device, a clock signal;

periodically sending, by the processor of the vehicle telematics device, the enable hibernate command signal to the hibernate control circuit based on the clock signal; and periodically sending, by the processor, the disable hibernate command signal to the hibernate control circuit based on the clock signal.

16. The method of claim 15, further comprising controlling, by the processor, the clock signal to adjust a period at which the processor sends the enable hibernate command signal and the disable hibernate command signal to the hibernate control circuit.

17. The method of claim 11, further comprising:
performing, by a processor of the vehicle telematics device, a function; and
sending, by the processor, the enable hibernate command signal to the hibernate control circuit in response to a determination by the processor that the function has been completed.

18. The method of claim 11, wherein the hibernatable circuit comprises a processor, and further comprising:
sending, by the processor, the enable hibernate command signal to the hibernate control circuit to cause processor to enter the low power state.

19. The method of claim 18, further comprising:
programming, by the processor, a counter; and
receiving, by the hibernate control circuit, the disable hibernate command signal in response to expiration of the counter.

20. The method of claim 11, further comprising receiving, by a non-hibernatable circuit, power from the local battery while the hibernatable circuit is in the low power state.

* * * * *